(12) United States Patent
Ohara et al.

(10) Patent No.: US 7,696,830 B2
(45) Date of Patent: Apr. 13, 2010

(54) DIGITAL CONTROLLED OSCILLATOR, FREQUENCY SYNTHESIZER, RADIO COMMUNICATION APPARATUS USING THE SAME, AND CONTROL METHOD FOR THE SAME

(75) Inventors: Atsushi Ohara, Shiga (JP); Hisashi Adachi, Osaka (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 11/968,909

(22) Filed: Jan. 3, 2008

(65) Prior Publication Data

US 2009/0002088 A1    Jan. 1, 2009

(30) Foreign Application Priority Data

Jun. 27, 2007    (JP)    ............... 2007-169135

(51) Int. Cl.
- *H03B 5/12* (2006.01)
- *H03L 7/085* (2006.01)
- *H03L 7/099* (2006.01)

(52) U.S. Cl. ................ 331/17; 331/36 C; 331/179
(58) Field of Classification Search ............ 331/1 A, 331/16–18, 25, 177 R, 177 V, 179

See application file for complete search history.

(56) References Cited

U.S. PATENT DOCUMENTS

| 2,543,629 | A  | * | 2/1951 | Hanert ................ 84/674 |
| 6,181,218 | B1 | * | 1/2001 | Clark et al. .......... 331/177 R |
| 6,734,741 | B2 |   | 5/2004 | Staszewski et al. |
| 6,747,522 | B2 | * | 6/2004 | Pietruszynski et al. .. 331/177 R |
| 7,046,098 | B2 | * | 5/2006 | Staszewski ............ 331/158 |

FOREIGN PATENT DOCUMENTS

JP    2002-033660    1/2002

* cited by examiner

*Primary Examiner*—David Mis
(74) *Attorney, Agent, or Firm*—McDermott Will & Emery LLP

(57) ABSTRACT

The digital controlled oscillator includes a variable capacitance section having a first capacitor array of a plurality of first variable capacitors and a second capacitor array of a plurality of second variable capacitors, and generates a signal having an oscillation frequency corresponding to the capacitance value of the variable capacitance section. The first capacitance change amount in the individual first variable capacitors is a value obtained by multiplying the second capacitance change amount in the individual second variable capacitors by an integer equal to or more than 2, and the number of second variable capacitors is equal to or more than a value obtained by subtracting 1 from the integer equal to or more than 2.

24 Claims, 18 Drawing Sheets

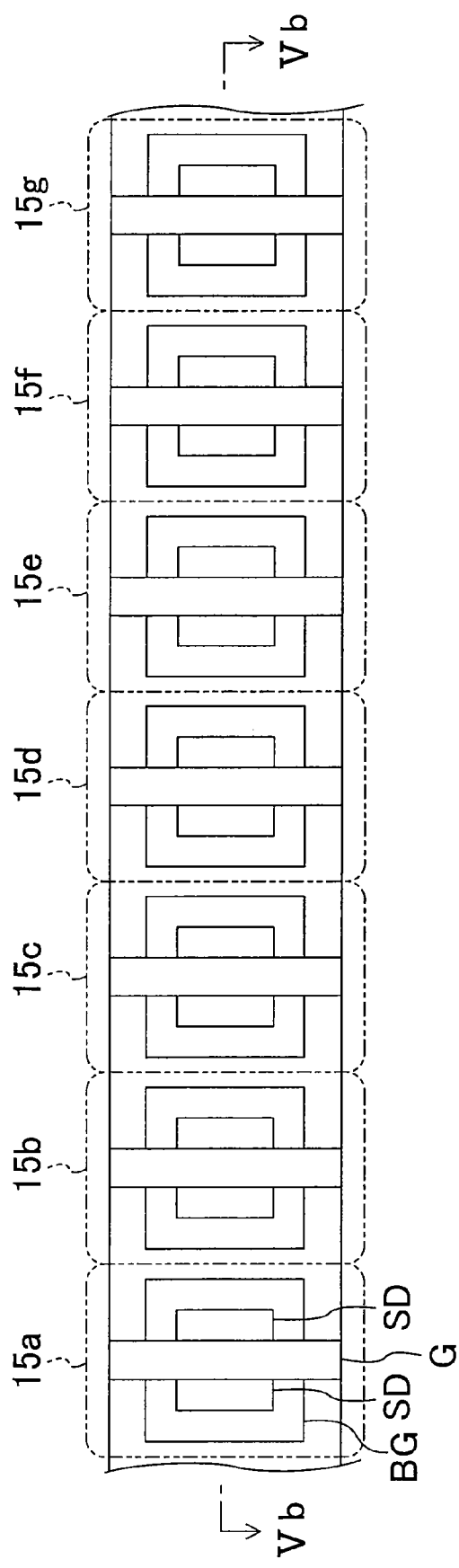
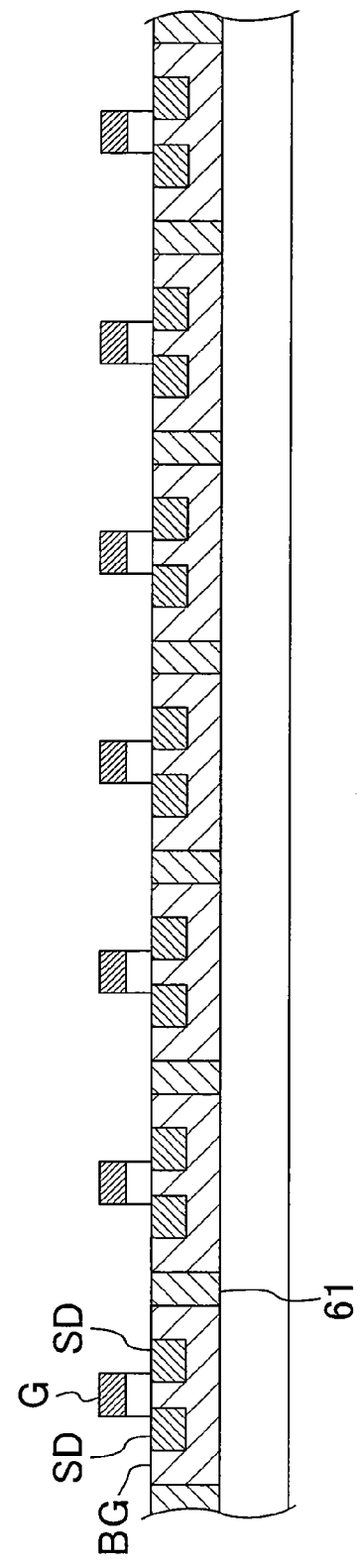
FIG. 5A
FIG. 5B

DIGITAL CONTROLLED OSCILLATOR, FREQUENCY SYNTHESIZER, RADIO COMMUNICATION APPARATUS USING THE SAME, AND CONTROL METHOD FOR THE SAME

CROSS-REFERENCE TO RELATED APPLICATIONS

This application claims priority under 35 U.S.C. §119 on Patent Application No. 2007-169135 filed in Japan on Jun. 27, 2007, the entire contents of which are hereby incorporated by reference.

BACKGROUND OF THE INVENTION

1. Technical Field

The present invention relates to a digital controlled oscillator used for a semiconductor integrated circuit, a frequency synthesizer including the same, a control method for the same, and a radio communication apparatus using such a frequency synthesizer.

2. Background Art

With semiconductors being finer and faster, a frequency synthesizer using a digital controlled oscillator (DCO) circuit controlled with a digital value, not an analog value, has been studied (see Japanese Laid-Open Patent Publication No. 2002-33660 and U.S. Pat. No. 6,734,741, for example).

FIG. 19 shows an exemplary conventional DCO circuit. As shown in FIG. 19, the conventional DCO circuit includes an inductor 201 and a variable capacitance section 202. The inductor 201 and the variable capacitance section 202 constitute an LC tank circuit, which outputs a signal having a frequency corresponding to the inductance of the inductor 201 and the capacitance of the variable capacitance section 202.

The variable capacitance section 202 has capacitor arrays 203 to 205 each composed of a plurality of varactors. The varactors are variable capacitors whose capacitance value changes between a low capacitive state and a high capacitive state larger in capacitance value than the low capacitive state. Therefore, by changing the capacitance values of the varactors from the low capacitive state to the high capacitive state with a control signal supplied to each capacitor array, the capacitance value of the variable capacitance section 202 changes.

The amount of change in frequency for each unit control signal, that is, the amount of change in frequency observed when the capacitance value of one variable capacitor is switched from its low capacitive state to its high capacitive state differs among the capacitor arrays. For example, the frequency changes by 3 MHz in the capacitor array 203, changes by 320 KHz in the capacitor 204, and changes by 10 KHz in the capacitor array 205. The capacitor arrays therefore cover different oscillation frequency ranges from one another as shown in FIG. 20. The oscillation frequency ranges covered by the capacitor arrays overlap each other, so as to permit the oscillation frequency of the DCO circuit to change in fine steps and also change widely.

However, the conventional digital controlled oscillator has the following problem. In wide-range modulation, to suppress increase in quantization noise, it is necessary to not only permit wide-range frequency variation but also reduce the minimum frequency change to as small as possible and yet keep the change amount constant.

To suppress increase in quantization noise, the frequency change for each unit control signal must be kept constant. In wide-range modulation, therefore, it is necessary to increase the number of control bits while keeping the minimum frequency change amount, that is, the minimum capacitance change amount of the variable capacitance section constant.

The conventional DCO circuit, having the variable capacitance section composed of three capacitor arrays, permits frequency variation over a considerably wide range. However, the changes in oscillation frequency at the operation of the respective capacitor arrays are independent of one another. For wide-range modulation, therefore, it is necessary to increase the number of varactors included in the capacitor array 205 to secure a wide range within which the frequency can be changed linearly. For example, to change the oscillation frequency in 64 steps linearly, at least 63 varactors will be necessary in the capacitor array 205. This causes a problem of increasing the area occupied by the variable capacitance section and thus the area occupied by the DCO circuit. Also, 64 control lines will be necessary to control the varactors in the capacitor array 205 individually. This will increase the area occupied by such control lines, and with the area increase, the parasitic capacitance will further increase.

As described above, if the number of control bits is increased while the unit capacitance is kept small, the occupation areas of the capacitors and the control lines will increase. With the area increase, the parasitic capacitance will also increase. The increase of the parasitic capacitance may cause a problem of narrowing the variable range of the oscillation frequency.

SUMMARY OF THE INVENTION

An object of the present invention is providing a digital controlled oscillator that is wide in the range within which the oscillation frequency changes linearly and small in occupation area.

To attain the above object, according to the present invention, the digital controlled oscillator is configured to have two or more capacitor arrays each composed of a plurality of variable capacitors, in which the capacitance change amount in each variable capacitor in one capacitor array is an integral multiple of the capacitance change amount in each variable capacitor in another capacitor array.

Specifically, the digital controlled oscillator of the present invention includes: an oscillator unit including a variable capacitance section having a first capacitor array and a second capacitor array and generating a signal having an oscillation frequency corresponding to a capacitance value of the variable capacitance section, the first capacitor array including a plurality of first variable capacitors selectable between a first capacitive state and a second capacitive state larger in capacitance value than the first capacitive state, the second capacitor array including a plurality of second variable capacitors selectable between a third capacitive state and a fourth capacitive state larger in capacitance value than the third capacitive state, wherein a first change amount as a difference in capacitance value between the first capacitive state and the second capacitive state is a value obtained by multiplying a second change amount as a difference in capacitance value between the third capacitive state and the fourth capacitive state by an integer equal to or more than 2, and the number of second variable capacitors is equal to or more than a value obtained by subtracting 1 from the integer equal to or more than 2.

According to the digital controlled oscillator of the present invention, the first capacitance change amount is a value obtained by multiplying the second capacitance change amount by an integer equal to or more than 2. Hence, the change in the capacitance of the variable capacitance section for each step is constant at any time. In other words, the capacitance value of the variable capacitance section changes while securing linearity over a wide range. Thus, a digital controlled oscillator whose oscillation frequency changes linearly over a wide range can be implemented. Also, the number of variable capacitors can be reduced and thus the occupation area of the variable capacitance section can be reduced, compared with the case of using only the second variable capacitors.

The frequency synthesizer of the present invention includes: a digital controlled oscillator unit including a variable capacitance section having a first capacitor array and a second capacitor array and generating a signal having an oscillation frequency corresponding to a capacitance value of the variable capacitance section, the first capacitor array including a plurality of first variable capacitors each having a first capacitive state and a second capacitive state larger in capacitance value than the first capacitive state, the second capacitor array including a plurality of second variable capacitors each having a third capacitive state and a fourth capacitive state larger in capacitance value than the third capacitive state; and an oscillation frequency control unit for controlling the capacitance value of the variable capacitance section by switching the individual first variable capacitors between the first capacitive state and the second capacitive state and switching the individual second variable capacitors between the third capacitive state and the fourth capacitive state, to control the oscillation frequency, wherein a first change amount as a difference in capacitance value between the first capacitive state and the second capacitive state is a value obtained by multiplying a second change amount as a difference in capacitance value between the third capacitive state and the fourth capacitive state by an integer equal to or more than 2, and the number of second variable capacitors is equal to or more than a value obtained by subtracting 1 from the integer equal to or more than 2.

According to the frequency synthesizer of the present invention, the first capacitance change amount is a value obtained by multiplying the second capacitance change amount by an integer equal to or more than 2. Hence, the change in the capacitance of the variable capacitance section for each step is constant at any time. In other words, the capacitance value of the variable capacitance section changes while securing linearity over a wide range. Thus, a synthesizer provided with a digital controlled oscillator whose oscillation frequency changes linearly over a wide range can be implemented. Also, the number of variable capacitors can be reduced and thus the occupation area of the variable capacitance section can be reduced, compared with the case of using only the second variable capacitors.

The control method for a digital controlled oscillator of the present invention is a method for controlling an oscillation frequency of a digital controlled oscillator, the digital controlled oscillator including a variable capacitance section having a first capacitor array including a plurality of first variable capacitors and a second capacitor array including a plurality of second variable capacitors, the method including the steps of: (a) generating multi-bit digital control data including high-order bit data for controlling the first capacitor array and low-order bit data for controlling the second capacitor array; and (b) selecting any of the first variable capacitors and second variable capacitors based on the digital control data to obtain an oscillation frequency corresponding to the digital control data, wherein the step (b) includes the steps of: (b1) switching a capacitance value of any of the first variable capacitors corresponding to the high-order bit data from a first capacitive state to a second capacitive state different from the first capacitive state by a first change amount; and (b2) switching a capacitance value of any of the second variable capacitors corresponding to the low-order bit data from a third capacitive state to a fourth capacitive state different from the third capacitive state by a second change amount, the second change amount being obtained by dividing the first change amount by an integer equal to or more than 2.

According to the control method for a digital controlled oscillator of the present invention, the capacitance value of the variable capacitance section changes by the first change amount according to the high-order bit data and changes by the second change amount according to the low-order bit data. The first change amount is an integral multiple of the second change amount. It is therefore possible to change the capacitance value of the variable capacitance section linearly according to the digital control data.

BRIEF DESCRIPTION OF THE DRAWINGS

FIGS. 4A and 4B show first variable capacitors in the digital controlled oscillator in Embodiment 1, in which FIG. 4A is a plan view and FIG. 4B is a cross-sectional view taken along line IVb-IVb in FIG. 4A.

FIGS. 5A and 5B show second variable capacitors in the digital controlled oscillator in Embodiment 1, in which FIG. 5A is a plan view and FIG. 5B is a cross-sectional view taken along line Vb-Vb in FIG. 5A.

DESCRIPTION OF THE PREFERRED EMBODIMENTS

Embodiment 1

Figure 1:
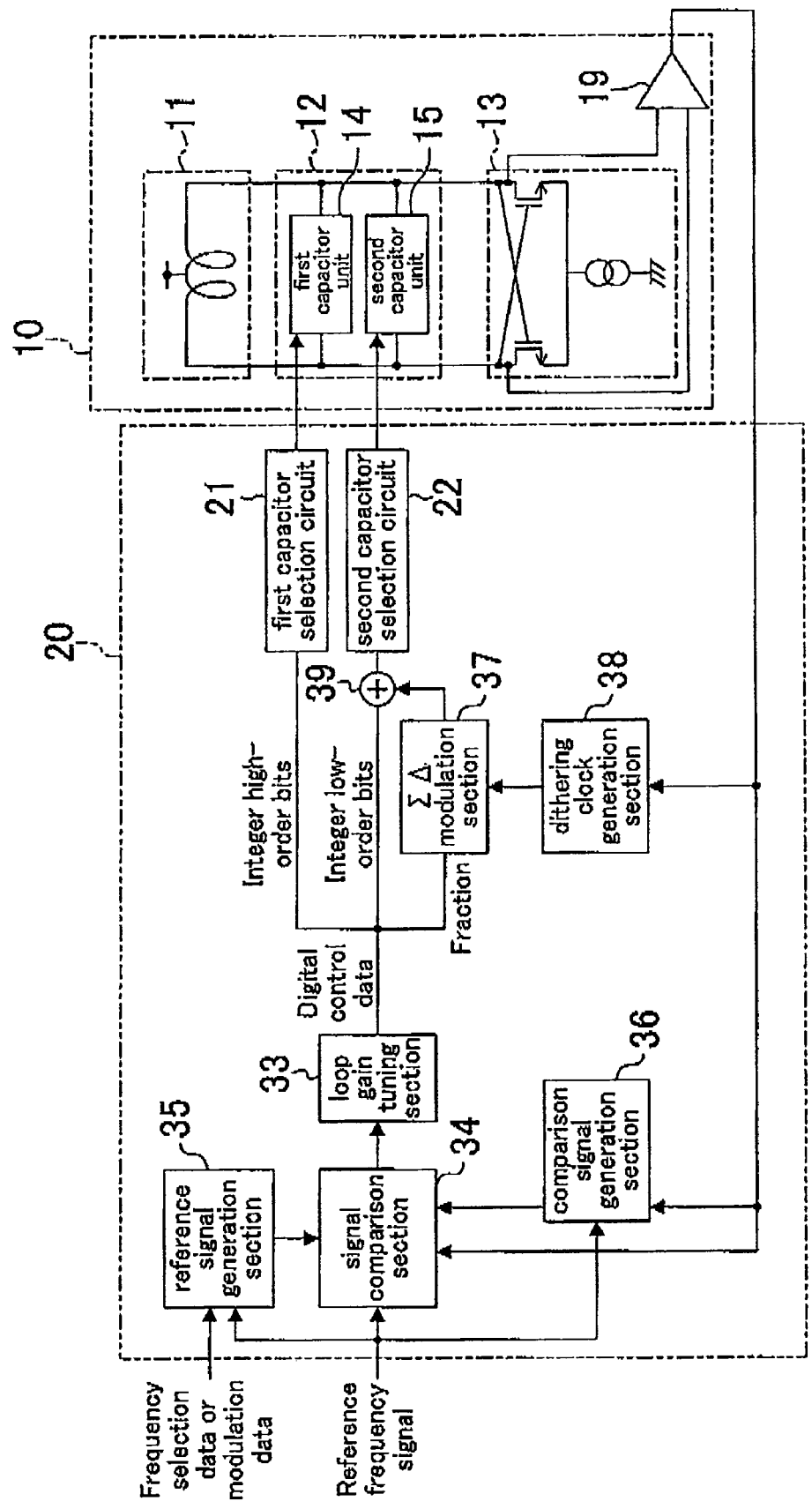
FIG. 1 is a block diagram of a frequency synthesizer of Embodiment 1 of the present invention.

Embodiment 1 of the present invention will be described with reference to the relevant drawings. FIG. 1 shows a circuit configuration of a frequency synthesizer of Embodiment 1. As shown in FIG. 1, the frequency synthesizer of this embodiment is a phased lock loop (PLL) circuit in which the oscillation frequency of a digital controlled oscillator (DCO) circuit 10 is loop-controlled by an oscillation frequency control unit 20.

The DCO circuit 10 is an LC oscillator circuit having an inductor 11, a variable capacitance section 12, a negative resistance generation section 13 and an output amplifier 19, in which the oscillation frequency can be changed by changing the capacitance value of the variable capacitance section 12.

The variable capacitance section 12 has a first capacitor array 14 and a second capacitor array 15. The first capacitor array 14 is composed of a plurality of first variable capacitors whose capacitance values individually change between a first capacitive state (low capacitive state) and a second capacitive state (high capacitive state) larger in capacitance value than the first capacitive state depending on an applied voltage. The second capacitor array 15 is composed of a plurality of second variable capacitors whose capacitance values individually change between a third capacitive state (low capacitive state) and a fourth capacitive state (high capacitive state) larger in capacitance value than the third capacitive state depending on an applied voltage. The capacitance values of the first and second capacitor arrays 14 and 15 can therefore be changed by changing the first and second variable capacitors from their low capacitive states to their high capacitive states or from their high capacitive states to their low capacitive states.

Switching of the capacitive states of the first and second variable capacitors is made by the oscillation frequency control unit 20. The output of the DCO circuit 10 is subjected to processing such as frequency division and integration in a comparison signal generation section 36 to be converted to a comparison signal. The comparison signal is compared with a reference signal in a signal comparison section 34. The reference signal is produced from a frequency selection data and a reference frequency signal inputted into a reference signal generation section 35. The signal comparison section 34 compares the comparison signal with the reference signal in phase, frequency or both phase and frequency, and outputs the comparison result corresponding to a deviation therebetween. A loop gain tuning section 33 tunes the comparison result into an appropriate loop gain, which is outputted as multi-bit digital control data.

The multi-bit digital control data includes digits (bits) representing the fraction part and digits (bits) representing the integer part. The number of digits representing the fraction part may be determined depending on the resolution of the oscillation frequency required. The integer part is further divided into high-order bits and low-order bits. The numbers of high-order and low-order bits may be determined depending on the numbers of the first and second variable capacitors.

The integer high-order bit data is inputted into a first capacitor selection circuit 21. As for the integer low-order bit data, fraction bit data ΣΔ-modulated by a ΣΔ modulation section 37 is added thereto by an adder 39, and the resultant data is inputted into a second capacitor selection circuit 22. The ΣΔ modulation section 37 is controlled with a dithering clock generated from the output of the DCO circuit 10 by a dithering clock generation section 38.

The first capacitor selection circuit 21 and the second capacitor selection circuit 22 in this embodiment are encoders, which individually convert inputted digital control data to a thermometer code for selecting corresponding first and second variable capacitors to put the selected variable capacitors into their high capacitive states. This changes the capacitance value of the variable capacitance section 12, and thus changes the oscillation frequency of the DCO circuit 10.

By controlling the oscillation frequency of the DCO circuit 10 so that there is no deviation between the comparison signal and the reference signal in the signal comparison section 34, a signal having a required oscillation frequency can be generated stably.

Hereinafter, the operation of the frequency synthesizer of Embodiment 1 will be described in more detail. For simplification of the description, it is herein assumed that the numbers of first variable capacitors and second variable capacitors are both seven, and that the numbers of integer high-order bits, integer low-order bits and fraction bits are all three.

Figure 2:
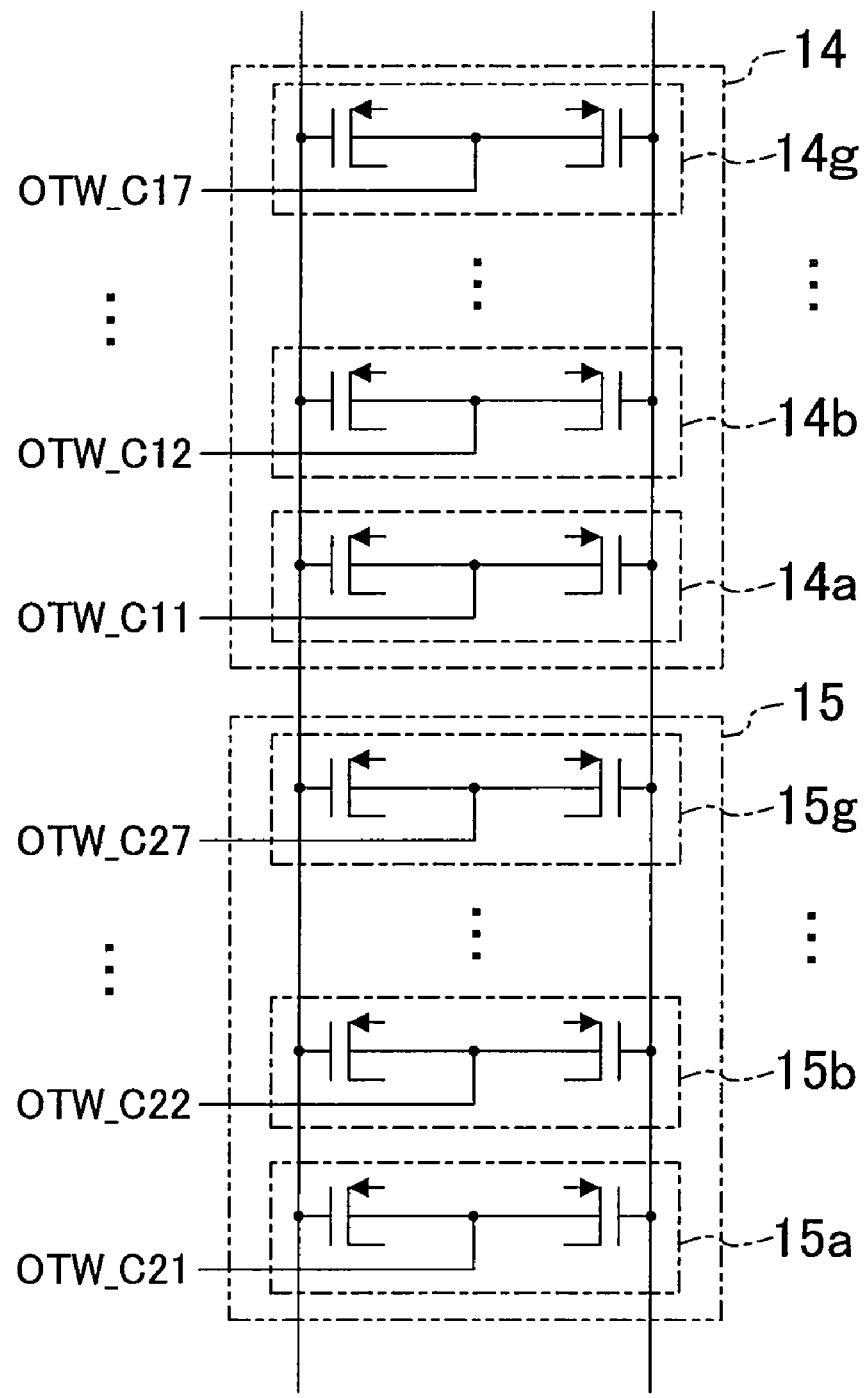
FIG. 2 is a circuit diagram of a variable capacitance section of a digital controlled oscillator in Embodiment 1 of the present invention.

FIG. 2 shows a circuit configuration of the variable capacitance section 12, in which the first capacitor array 14 and the second capacitor array 15 are connected in parallel. The first capacitor array 14 includes seven first variable capacitors 14a to 14g, each formed of two varactors, connected in parallel. The second capacitor array 15 includes seven second variable capacitors 15a to 15g, each formed of two varactors, connected in parallel.

The first variable capacitors 14a to 14g of the first capacitor array 14 are connected with the first capacitor selection circuit 21 via selection signal lines OTW_C11 to OTW_C17, respectively. The second variable capacitors 15a to 15g of the second capacitor array 15 are connected with the second capacitor selection circuit 22 via selection signal lines OTW_C21 to OTW_C27, respectively.

Figure 3A:
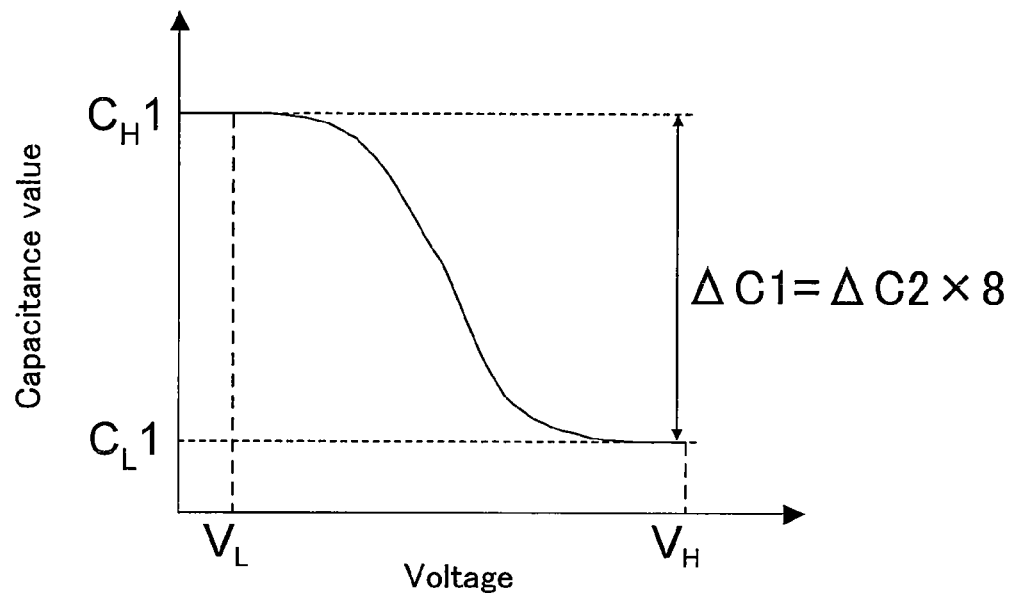
FIGS. 3A and 3B are graphs showing the relationship between the capacitance values of a first variable capacitor and a second variable capacitor, respectively, in the digital controlled oscillator in Embodiment 1 and the voltage of a selection signal line.
Figure 3B:
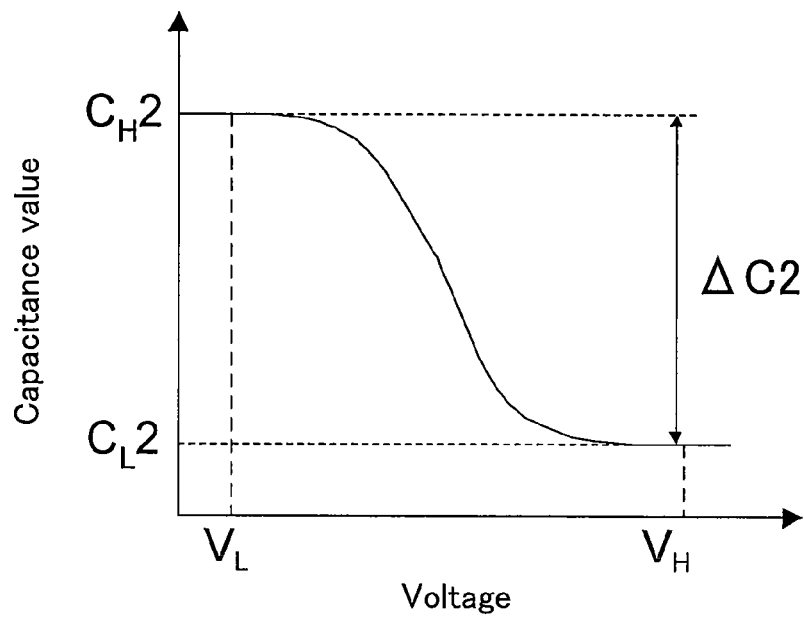

FIGS. 3A and 3B show the relationships between the capacitance values of a first variable capacitor and a second variable capacitor, respectively, and the voltage of a selection signal line. The first variable capacitor is in a high capacitive state with the capacitance value being $C_H1$ when the voltage applied to the selection signal line is $V_L$, and is in a low capacitive state with the capacitance value being $C_L1$ when the voltage applied to the selection signal line is $V_H$. Hence, the change amount in capacitance value observed when the voltage applied to the selection signal line is changed from $V_L$ to $V_H$ is $C_H1-C_L1=\Delta C1$. Likewise, the second variable capacitor is in a high capacitive state with the capacitance value being $C_H2$ when the voltage applied to the selection signal line is $V_L$, and is in a low capacitive state with the capacitance value being $C_L2$ when the voltage applied to the selection signal line is $V_H$. Hence, the change amount in capacitance value observed when the voltage applied to the selection signal line is changed from $V_L$ to $V_H$ is $C_H2-C_L2=\Delta C2$. Note that $\Delta C1$ is set eight times as large as $\Delta C2$.

Having the configuration described above, the capacitance value of the variable capacitance section 12 can be changed in 64 steps by $\Delta C2$ each. If it is intended to attain the 64-step change by $\Delta C2$ each using only the second variable capacitors having a change amount of ΔC2, a total of 63 second variable capacitors will be necessary. In this embodiment, however, in which the second variable capacitors having a change amount of ΔC2 and the first variable capacitors having a change amount of 8×ΔC2, the 64-step change can be attained only with seven second variable capacitors and seven first variable capacitors.

FIGS. 4A and 4B and FIGS. 5A and 5B show specific layout patterns of the first capacitor array 14 and the second capacitor array 15, respectively. As shown in FIGS. 5A and 5B, which are respectively a plan view and a cross-sectional view taken along line Vb-Vb in FIG. 5A, the second capacitor array 15 is composed of seven second variable capacitors 15a to 15g isolated from one another with an element isolation region 61 as a p-type region. Each of the second variable capacitors has a gate region G, n-type source/drain diffusion regions SD formed on both sides of the gate region G, and an n-type back-gate diffusion region BG surrounding the source/drain diffusion regions SD.

Figure 4A:
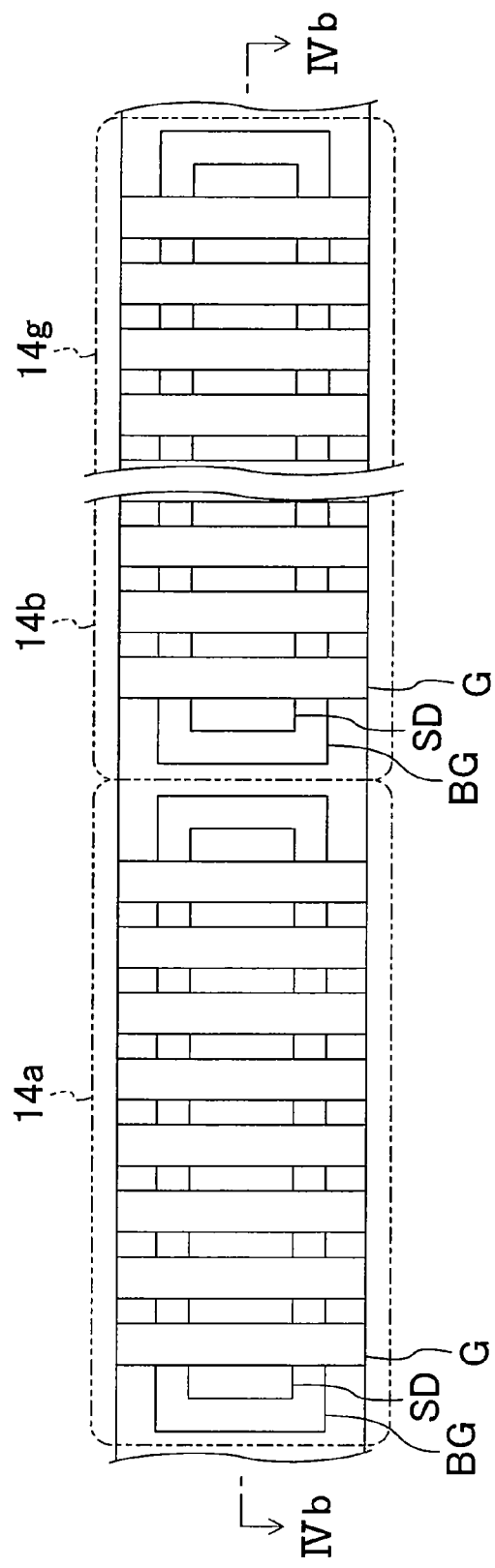
Figure 4B:
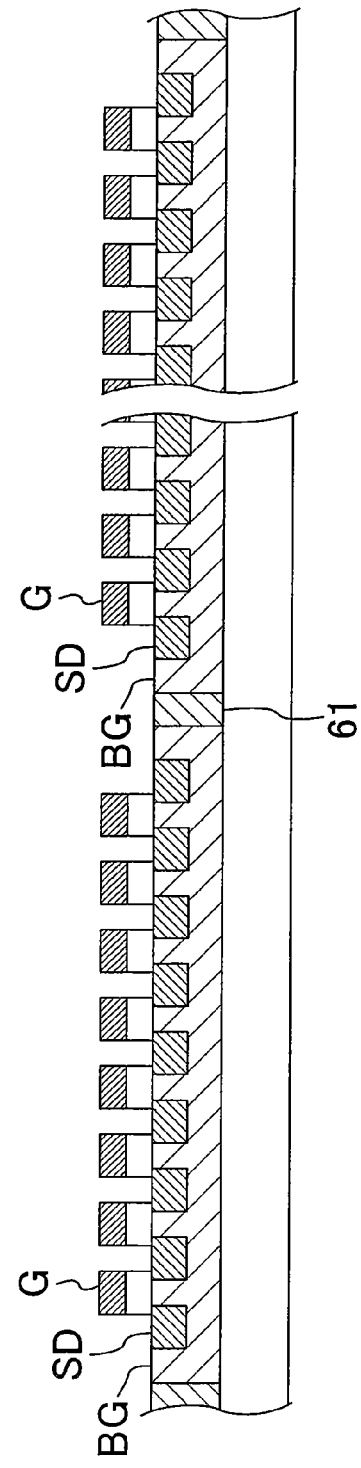

Likewise, as shown in FIGS. 4A and 4B, which are respectively a plan view and a cross-sectional view taken along line IVb-IVb in FIG. 4A, the first capacitor array 14 is composed of seven first variable capacitors 14a to 14g isolated from one another with an element isolation region. Each of the first variable capacitors has eight gate regions G, n-type source/drain diffusion regions SD formed on both sides of each of the gate regions G, and an n-type back-gate diffusion region BG surrounding the source/drain diffusion regions SD. One first variable capacitor is equivalent to eight second variable capacitors connected in parallel, and has a capacitance value eight times as large as one second variable capacitor. The occupation area of one first variable capacitor on the substrate is however about two to four times as large as that of one second variable capacitor.

Accordingly, the occupation area of seven second variable capacitors and seven first variable capacitors is less than a half of the occupation area of 64 second variable capacitors. In addition, since the number of lines for draw-out can be reduced, the area of routing regions can also be reduced. Moreover, with the reduced area, the parasitic capacitance of draw-out lines for the source/drain regions can be reduced. If the parasitic capacitance of draw-out lines for the source/drain regions increases, the change amount in capacitance value will be deviated from ΔC2, failing to maintain the linearity of the capacitance change in the variable capacitance section 12. In view of this, by providing the first variable capacitors and the second variable capacitors with ΔC1 being an integral multiple of ΔC2, as in this embodiment, it is possible to not only reduce the occupation area of the variable capacitance section 12 but also further improve the linearity of the capacitance change in the variable capacitance section 12.

The left and right elements, as viewed from FIG. 2, included in each of the first variable capacitors 14a to 14g and second variable capacitors 15a to 15g in FIG. 2 may be formed integrally inside a region surrounded by the element isolation region 61. In this case, also, the area reduction effect as described above can be obtained.

Figure 6:
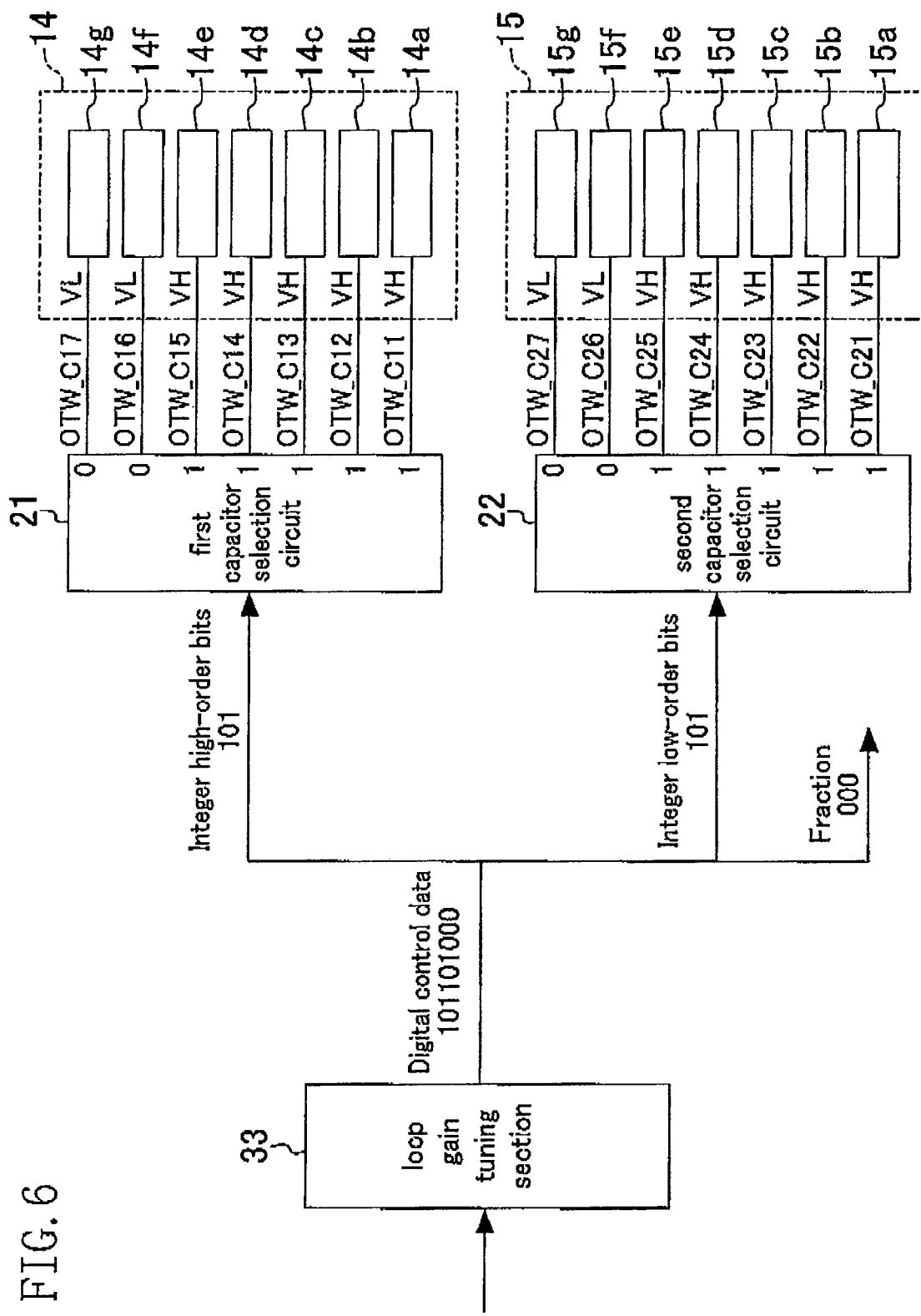
FIG. 6 is a block diagram of part of an oscillation frequency control unit of the frequency synthesizer of Embodiment 1.

FIG. 6 illustrates how the first capacitor selection circuit 21 and the second capacitor selection circuit 22 convert the digital control data outputted from the loop gain tuning section 33 to a thermometer code for selection in the first capacitor array 14 and the second capacitor array 15. Note that in the following description it is assumed that the number of first variable capacitors is seven, the number of integer high-order bits is three, the number of second variable capacitors is seven, the number of integer low-order bits is three, and the number of fraction bits is three.

Assuming that the digital control data currently outputted from the loop gain tuning section 33 is a binary code 101101000, the integer high-order bits are 101 in binary code, the integer lower order bits are 101 in binary code, and the fraction bits are 000 in binary code. This data represents 45.0 in the decimal system, indicating that an equivalent of 45 second variable capacitors must be put into a low capacitive state.

The integer high-order bits are inputted into the first capacitor selection circuit 21 as they are and converted to a thermometer code. The first capacitor selection circuit 21, receiving a binary code 101, outputs a thermometer code 0011111. With this thermometer code, the selection signal lines OTW-C11 to OTW-C15 become $V_H$ while the selection signal lines OTW-C16 and OTW-C17 become $V_L$. Having these voltages, the first variable capacitors 14a to 14e are put into their low capacitive state with the capacitance value being $C_L1$ while the first variable capacitors 14f and 14g are put into their high capacitive state with the capacitance value being $C_H1$.

Since the fraction data, which is currently 0, is neglected, the integer low-order bits 101 in binary code are inputted into the second capacitor selection circuit 22, which then outputs a thermometer code 0011111. With this thermometer code, the selection signal lines OTW-C21 to OTW-C25 become $V_H$ while the selection signal lines OTW-C26 and OTW-C27 become $V_L$. Having these voltages, the second variable capacitors 15a to 15e are put into their low capacitive state with the capacitance value being $C_L2$ while the second variable capacitors 15f and 15g are put into their high capacitive state with the capacitance value being $C_H2$.

In this embodiment, the change amount ΔC1 in the capacitance value of each first variable capacitor is eight times as large as the change amount ΔC2 in the capacitance value of each second variable capacitor. Therefore, the change in capacitance value resulting from five first variable capacitors and five second variable capacitors being put into their low capacitive states is equivalent to the change in capacitance value resulting from 5×8+5=45 second variable capacitors being put into their low capacitive state.

When the digital control data is incremented by 1 to give a binary code 101110000, the output of the first capacitor selection circuit 21 remains unchanged, but the thermometer code outputted from the second capacitor selection circuit 22 becomes 0111111. As a result, five first variable capacitors and six second variable capacitors are put into their low capacitive states. The capacitance value of the variable capacitance section 12 therefore changes by ΔC2. Likewise, when the digital control data is decremented by 8 to give a binary code 100101000, the thermometer code outputted from the first capacitor selection circuit 21 becomes 0001111 while the output of the second capacitor selection circuit 22 remains unchanged. As a result, four first variable capacitors and five second variable capacitors are put into their low capacitive states. The capacitance value of the variable capacitance section 12 therefore changes by ΔC1=8×ΔC2. In this way, the capacitance value of the variable capacitance section 12 can be changed in 64 steps by ΔC2 each.

In the frequency synthesizer of this embodiment, the digital control data has the fraction part. By controlling the second capacitor array 15 with ΣΔ modulation based on the fraction data, each step can further be divided to enhance the resolution. For example, assuming that the digital control data is a binary code 101101101, the fraction part is 0.625 in the decimal system, and thus a total of 5.625 second variable capacitors may be selected. The fraction data is noise-shaped by the ΣΔ modulation section 37 and then added to the integer low-order bit data by the adder 39. Thus, to give an average value of 5.625, a group of binary codes corresponding to 5, 4, 6, 7, 4, 7, 7, 5, . . . , for example, is inputted into the second capacitor selection circuit 22 in a time division manner. The second capacitor selection circuit 22 then generates thermometer codes 0011111, 0001111, 0111111, 1111111, 0001111, 1111111, 11111, 0011111, . . . in response to the inputted data. In this way, 5.625 second variable capacitors in average are selected and put into their low capacitive state. Note that in this case, the second capacitor array 15 is controlled with data changing discretely with a clock.

Figure 7:
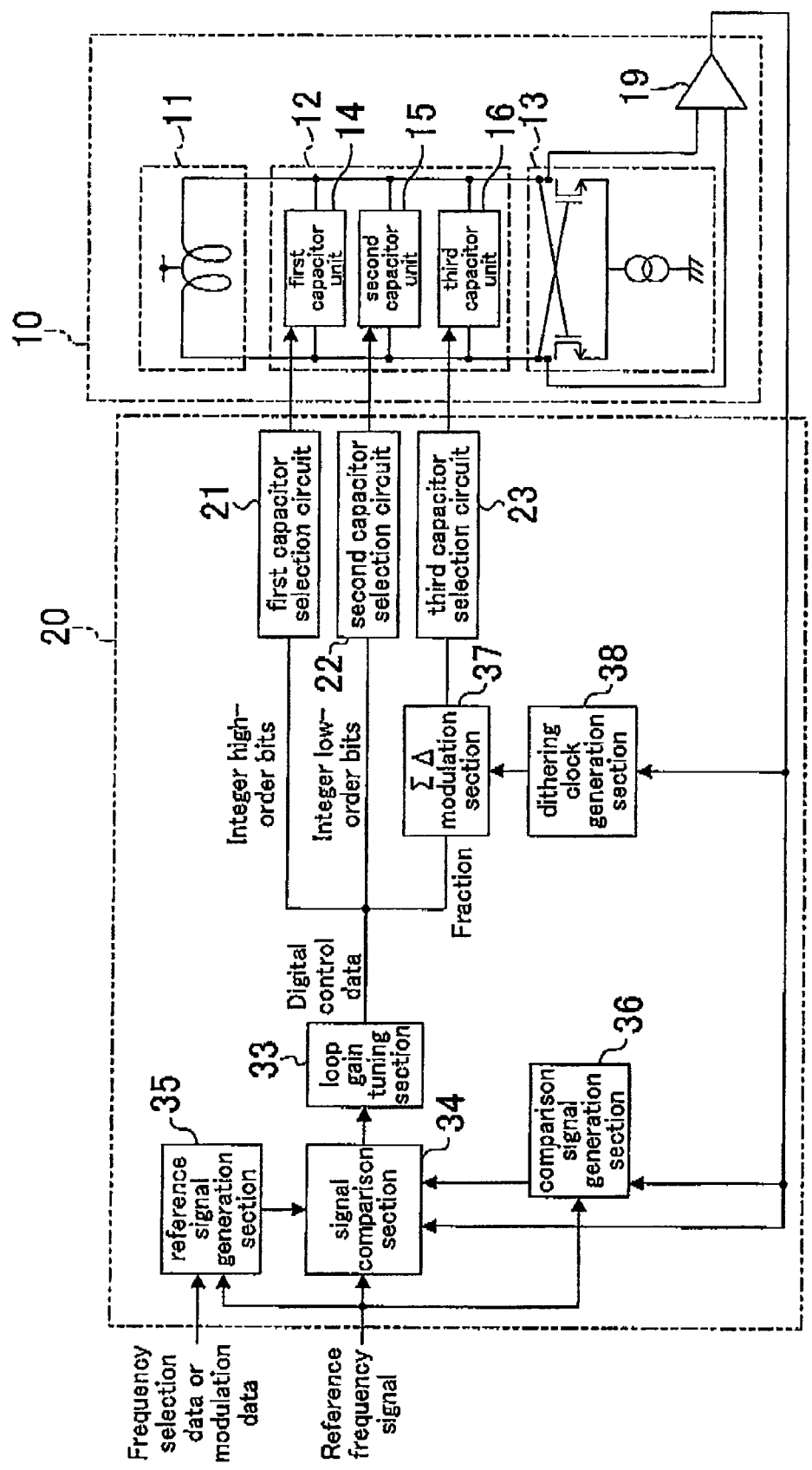
FIG. 7 is a block diagram of an alteration to the frequency synthesizer of Embodiment 1 of the present invention.

In this embodiment, the ΣΔ-modulated fraction data is added to the integer low-order bit data. Alternatively, as shown in FIG. 7, a third capacitor array 16 and a third capacitor selection circuit 23 may be additionally provided, to permit selection of capacitors with fraction data. The third capacitor array 16 may be composed of third variable capacitors each changing its capacitance value between a fifth capacitive state (low capacitive state) and a sixth capacitive state (high capacitive state) larger in capacitance value than the fifth capacitive state. The capacitance change amount in the third variable capacitors may be the same as that in the second variable capacitors. Although the occupation area of the variable capacitance section 12 increases with the formation of the third capacitor array 16, the circuit design will be easier because by separating the integer low-order bits from the fraction part, the high-speed operation of the ΣΔ modulation section can only be made for the third capacitor array 16.

Figure 8:
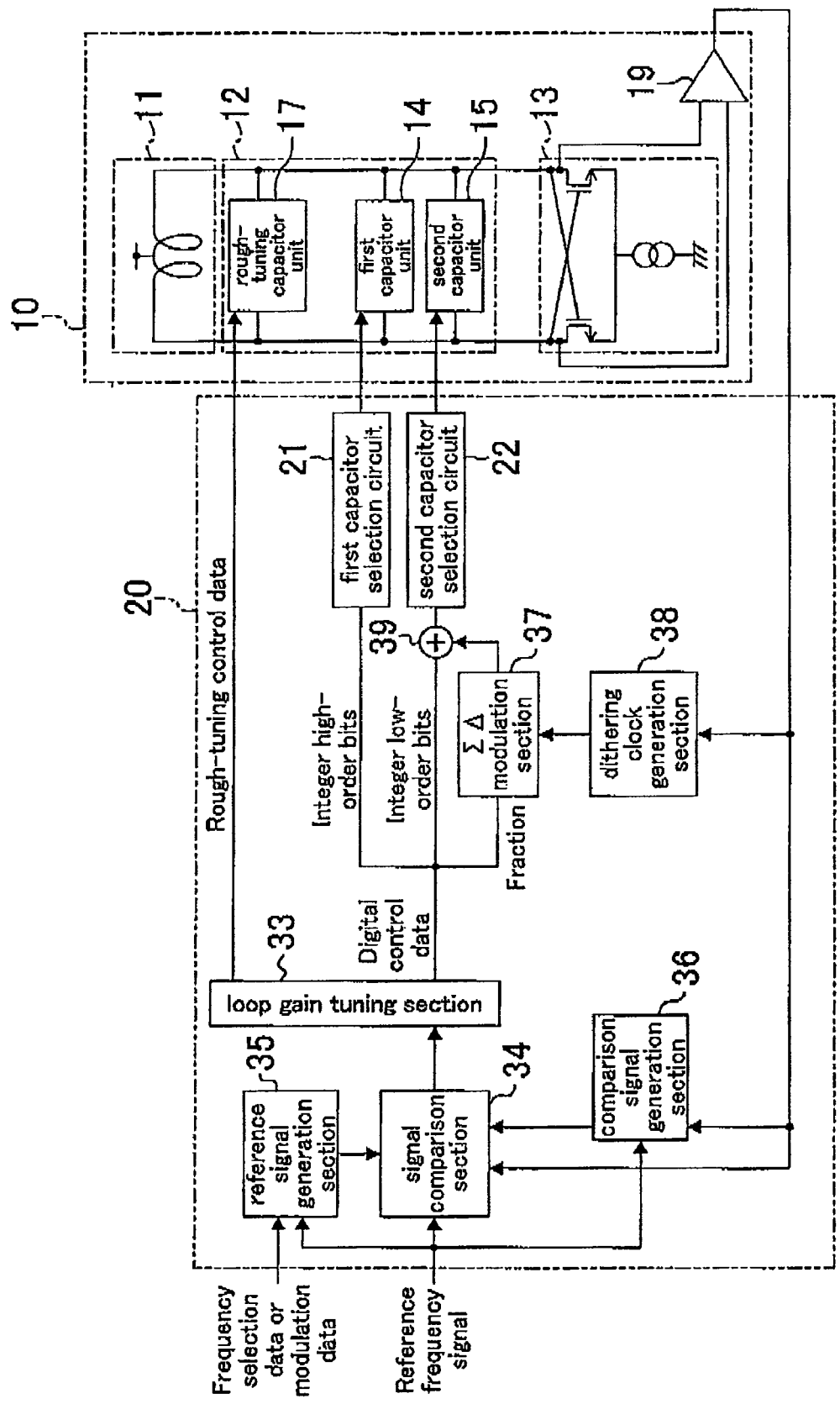
FIG. 8 is a block diagram of another alteration to the frequency synthesizer of Embodiment 1 of the present invention.
Figure 9:
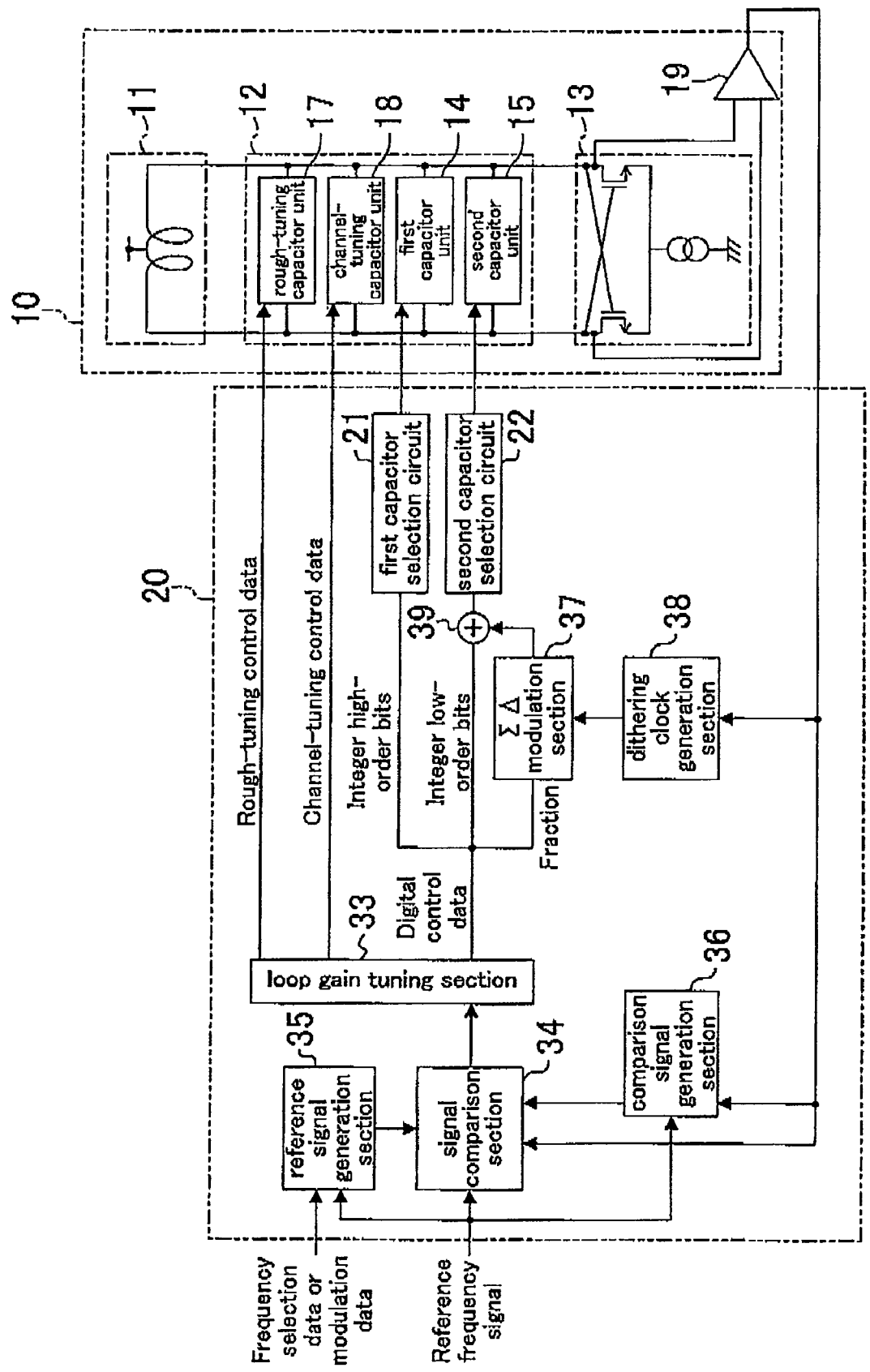
FIG. 9 is a block diagram of yet another alteration to the frequency synthesizer of Embodiment 1 of the present invention.

Alternatively, as shown in FIG. 8, if a large change in oscillation frequency is necessary, a rough-tuning capacitor array 17 may be provided in the variable capacitance section 12. Moreover, as shown in FIG. 9, a channel-tuning capacitor array 18 may further be provided in addition to the rough-tuning capacitor array 17.

Embodiment 2

Figure 10:
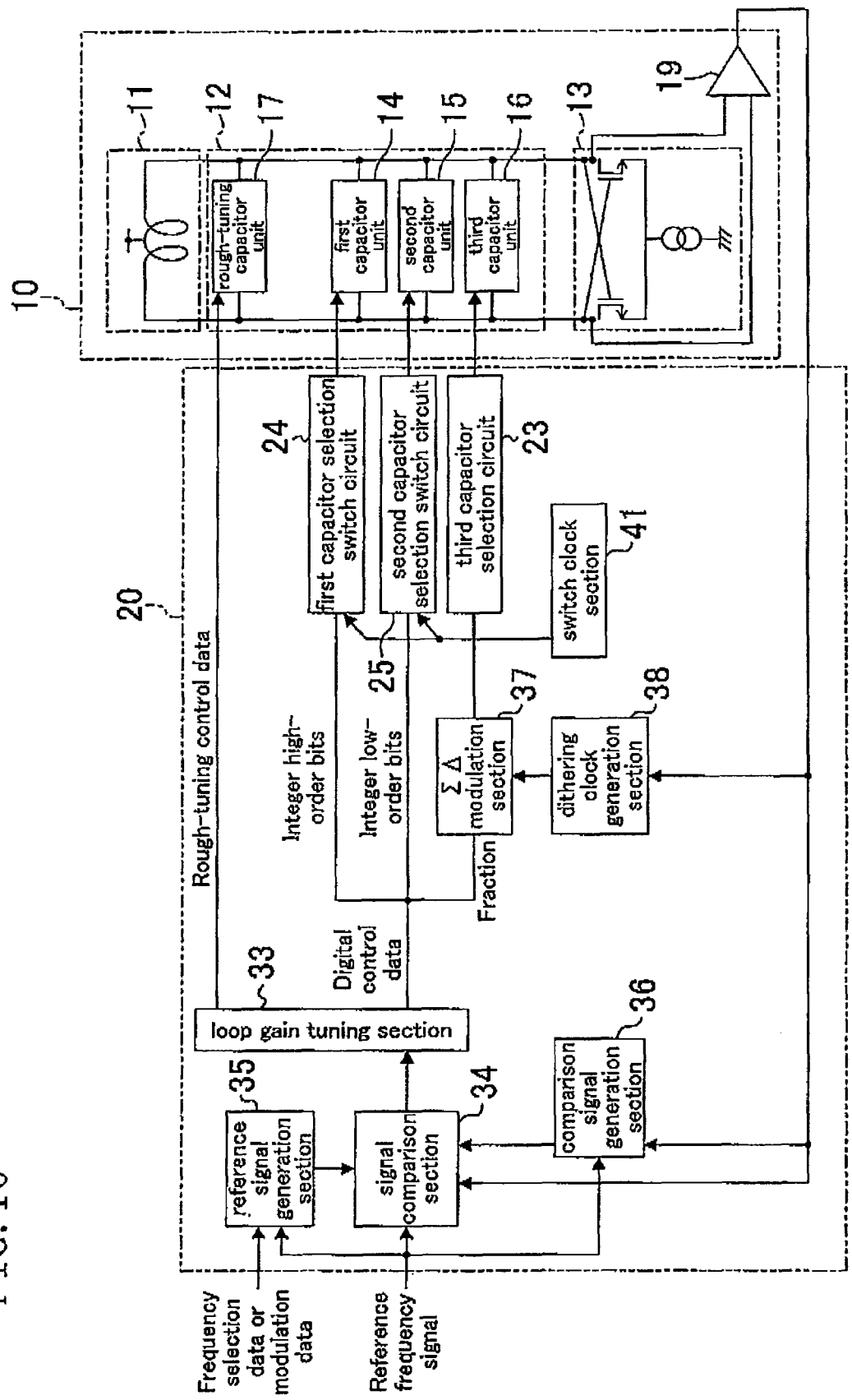
FIG. 10 is a block diagram of a frequency synthesizer of Embodiment 2 of the present invention.

Hereinafter, Embodiment 2 of the present invention will be described with reference to the relevant drawings. FIG. 10 shows a circuit configuration of a frequency synthesizer of Embodiment 2. In FIG. 10, the same components as those in FIG. 9 are denoted by the same reference numerals, and description thereof is omitted here.

The capacitance value of the variable capacitance section 12 should desirably change linearly. It is therefore desirable for the capacitance value of the second capacitor array 15 to change by $\Delta C2$ each precisely when the voltages of the selection signal lines OTW_C21 to OTW_C27 are turned from $V_L$ to $V_H$ in sequence. However, it is impossible to completely eliminate variations in the second variable capacitors. For example, in the circuit of FIG. 2, the change in capacitance value deviates between the case of selecting the second variable capacitor 15a and the case of selecting the second variable capacitor 15b.

As shown in FIG. 10, the oscillation frequency control unit 20 of this embodiment includes a first capacitor selection switch circuit 24 and a second capacitor selection switch circuit 25 driven by a switch clock section 41, instead of the first and second capacitor selection circuits 21 and 22 that are simply encoders.

The first capacitor selection switch circuit 24 and the second capacitor selection switch circuit 25 perform dynamic element matching in which code conversion is made to select different selection control lines in synchronization with a switch clock supplied from the switch clock section 41.

For example, if receiving a binary code 011, the first capacitor selection switch circuit 24 outputs a plurality of codes that individually turn voltages of any three out of the control lines OTW_C11 to OTW_C17 to $V_H$ in a time division manner. In other words, different combinations of first variable capacitors are selected based on the switch clock and turned to the low capacitive state. This averages variations in the first variable capacitors.

The second capacitor selection switch circuit 25 similarly outputs codes in a time division manner, and thus variations in the second variable capacitors are also averaged. In this way, the linearity of the capacitance value of the variable capacitance section 12 improves.

Embodiment 3

Figure 11:
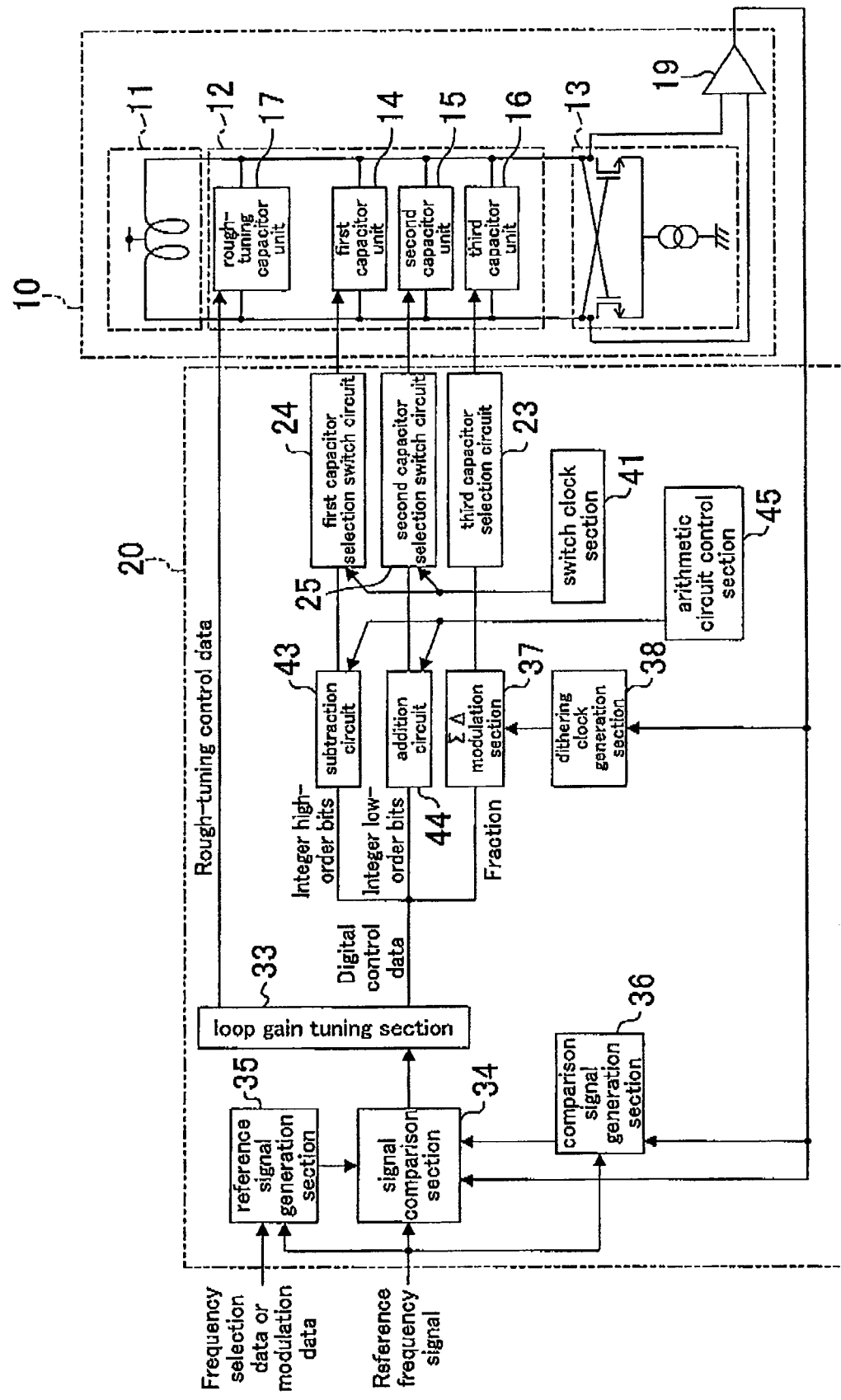
FIG. 11 is a block diagram of a frequency synthesizer of Embodiment 3 of the present invention.

Hereinafter, Embodiment 3 of the present invention will be described with reference to the relevant drawings. FIG. 11 shows a circuit configuration of a frequency synthesizer of Embodiment 3. In FIG. 11, the same components as those in FIG. 10 are denoted by the same reference numerals, and description thereof is omitted here.

As shown in FIG. 11, the oscillation frequency control unit 20 in this embodiment further includes a subtraction circuit 43 for performing subtraction for the integer high-order bit data of the digital control data, an addition circuit 44 for performing addition for the integer low-order bit data of the digital control data, and an arithmetic circuit control section 45 for controlling the subtraction circuit 43 and the addition circuit 44.

To ensure the linearity of the change in the capacitance value of the variable capacitance section 12, the change amount $\Delta C1$ in the capacitance value of the individual first variable capacitors must be precisely eight times as large as the change amount $\Delta C2$ in the capacitance value of the individual second variable capacitors. However, $\Delta C1$ may possibly fail to be precisely eight times as large as $\Delta C2$ because minute variations may occur due to a difference in layout between the capacitor arrays, apart from the variations in the variable capacitors described in Embodiment 2.

For example, suppose $\Delta C2$ is larger than a defined value by 5%, for example. Assuming that the defined change amount in the capacitance value of the individual second variable capacitors is a, $\Delta C2$ will be 1.05a while $\Delta C1$ is 8a. In this case, when the digital control data changes from 000111000 to 001000000, the change amount in capacitance value will be 8a−7×1.05a=0.65a. This degrades the linearity of the change in the capacitance value of the variable capacitance section 12.

In the frequency synthesizer of this embodiment, the second variable group 15 is composed of 15 second variable capacitors. The arithmetic circuit control section 45 turns ON the subtraction circuit 43 and the addition circuit 44 if the integer high-order bit data of the digital control data is equal to or greater than 001 in binary code. With these circuits being turned ON, 1 is subtracted from the integer high-order bit data while binary data 1000 is added to the integer low-order bit data. In this case, therefore, assuming that the digital control data is a binary code 001101000, the integer high-order bits are 000 in binary code while the integer low-order bits are 1101 in binary code.

As a result, the first capacitor selection switch circuit 24 outputs a thermometer code 0000000 and the second capacitor selection switch circuit 25 outputs a thermometer code 001111111111111.

With the above configuration, it is possible to secure a wide range within which the change in the capacitance value of the variable capacitance section 12 remains linear even when ΔC1 is not precisely eight times as large as ΔC2.

Figure 12:
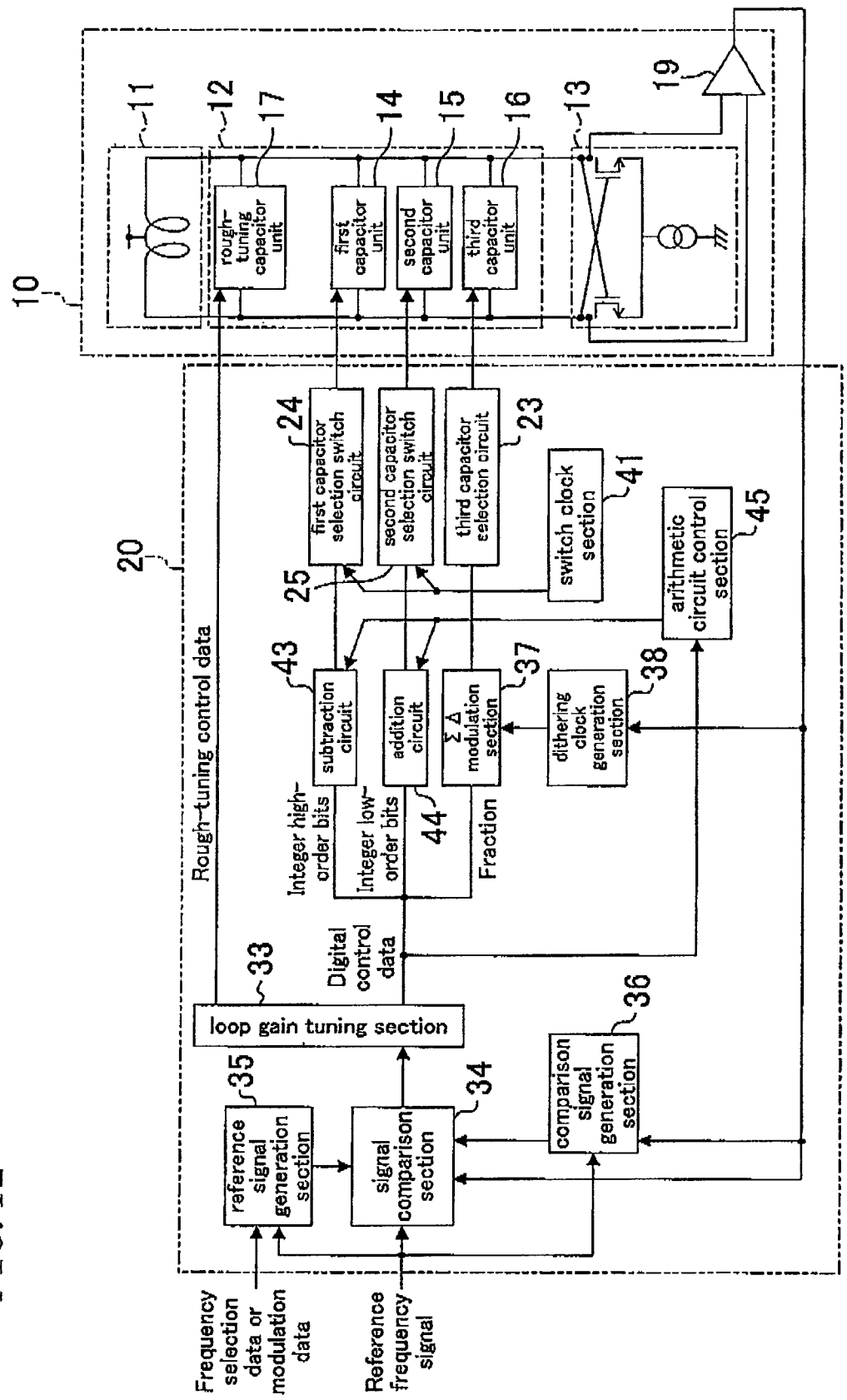
FIG. 12 is a block diagram of an alteration to the frequency synthesizer of Embodiment 3 of the present invention.

Although the circuit of FIG. 11 can widen the range within which the variable capacitance section 12 exhibits excellent linearity, the linearity will be degraded when a first variable capacitor is put into its capacitive state. To prevent this degradation in linearity occurring when a first variable capacitor is put into its capacitive state, a frequency synthesizer of FIG. 12 is configured to control the arithmetic circuit control section 45 based on the integer low-order bit data of the digital control data, to thereby switch the ON/OFF states of the subtraction circuit 43 and addition circuit 44 in a time division manner.

Assuming that the duration for which the subtraction circuit 43 and the addition circuit 44 are OFF is $T_{off}$, the duration for which these circuits are ON is $T_{on}$, and the value of the integer low-order bit data is k, $T_{off}:T_{on}=$k:m−k may be satisfied, where m is the radio of the defined value of ΔC1 to the defined value of ΔC2, which is 8 in this embodiment.

With the above setting, when the binary code of the digital control data changes from 001000000 to 001001000, for example, in which k=1, the change in the capacitance value of the variable capacitance section 12 is ((8a×1+1.05a×1)×1+ (1.05a×9)×7)/8−1.05a×8=1a. The change amount is therefore equal to the defined value a.

As described above, when the binary code of the digital control data is equal to or greater than 001000000, the amount by which the capacitance value of the variable capacitance section 12 changes every step can be the defined value a. Thus, the linearity of the capacitance change in the variable capacitance section 12 can be greatly improved.

Thus, by switching the OFF/ON states of the subtraction circuit 43 and addition circuit 44 in a time division manner, the change in the capacitance value of the variable capacitance section 12 exhibits good linearity even when the change amount ΔC1 in the capacitance value of the individual first variable capacitors is not precisely eight times as large as the change amount ΔC2 in the capacitance value of the individual second variable capacitors. This makes it possible to configure the first variable capacitors differently from the second variable capacitors and the third variable capacitors.

For example, variable capacitors low in capacitance density such as varactors can be used for the second and third variable capacitors, while variable capacitors high in capacitance density such as interconnect capacitances can be used for the first variable capacitors. By using variable capacitors high in capacitance density for the first variable capacitors that require a large capacitance change, the occupation area of the variable capacitance section 12 can be reduced.

(First Alteration to Embodiment 3)

Figure 13:
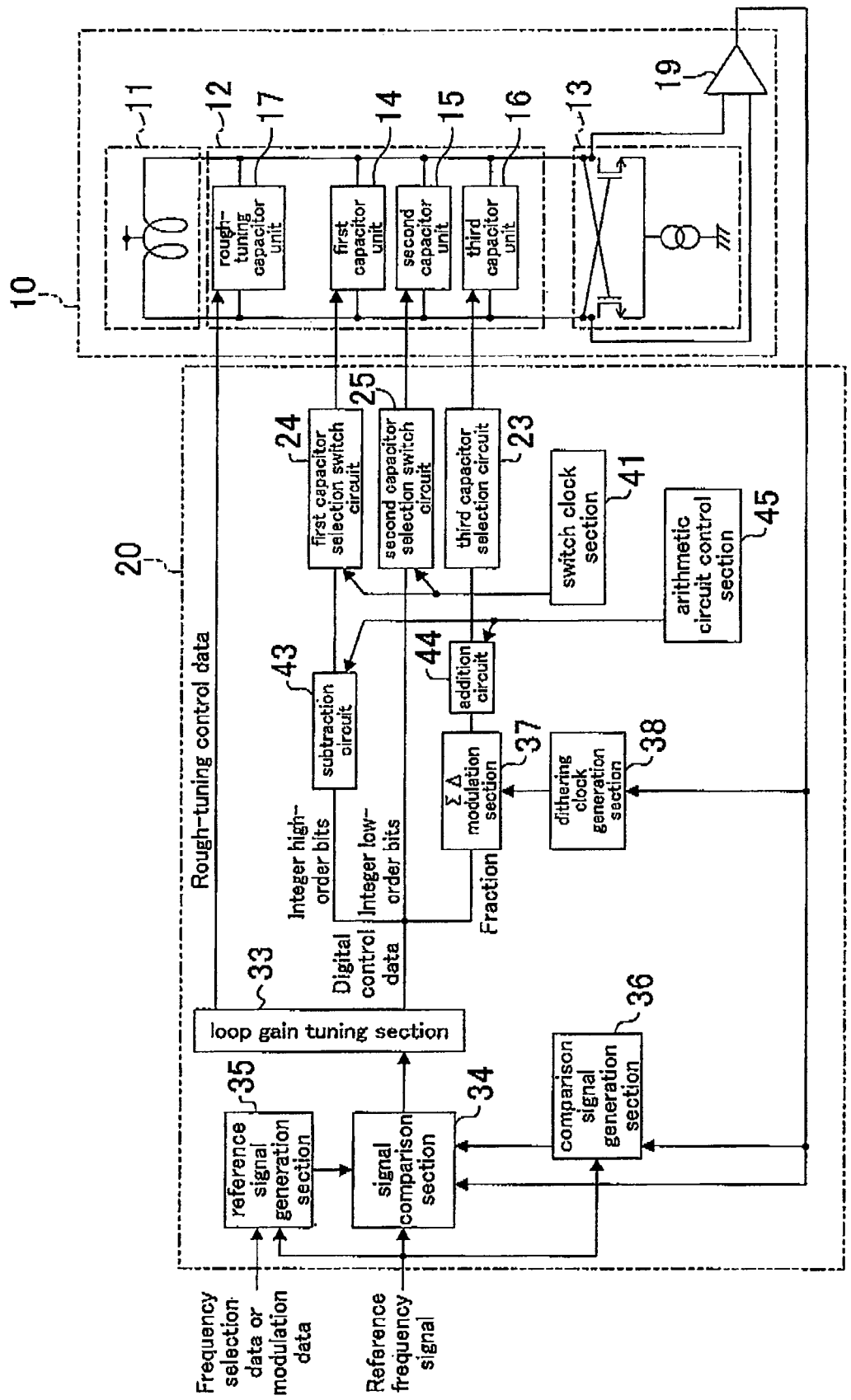
FIG. 13 is a block diagram of a frequency synthesizer of the first alteration of Embodiment 3 of the present invention.

Hereinafter, the first alteration to Embodiment 3 of the present invention will be described with reference to the relevant drawings. FIG. 13 shows a circuit configuration of a frequency synthesizer of this alteration. In FIG. 13, the same components as those in FIG. 12 are denoted by the same reference numerals, and description thereof is omitted here.

As shown in FIG. 13, addition is made for the fraction data after the ΣΔ modulation. In this case, the third capacitor array 16 includes 15 third variable capacitors.

By performing addition for the third capacitor array 16, not the second capacitor array 15, the region operating at high speed can be reduced, and this can reduce power consumption. Also, the control clock of the arithmetic circuit control section 45 can be made synchronous with the clock of the ΣΔ modulation section 37.

Figure 14:
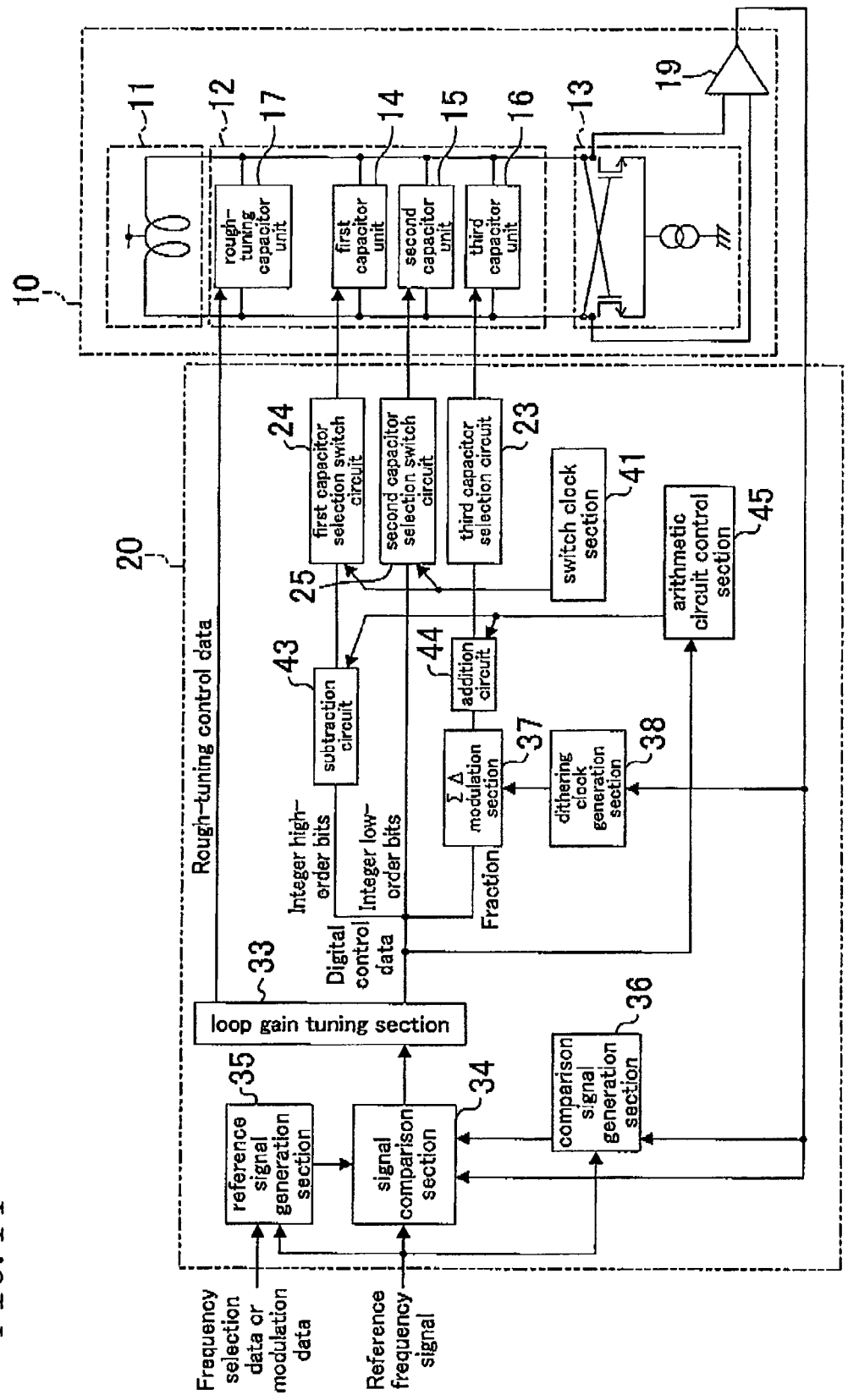
FIG. 14 is a block diagram of an alteration to the frequency synthesizer of the first alteration of Embodiment 1 of the present invention.

In the case of performing addition for the fraction data, also, the arithmetic circuit control section 45 can be controlled based on the integer low-order bit data of the digital control data as shown in FIG. 14. This enables switching ON/OFF of the subtraction circuit 43 and addition circuit 44 in a time division manner, and thus the linearity of the capacitance change in the variable capacitance section 12 can be further improved.

(Second Alteration to Embodiment 3)

Hereinafter, the second alteration to Embodiment 3 of the present invention will be described. The oscillation frequency f of the DCO circuit 10 is 1/(2π√(LC)) where L is the inductance of the inductor 11 and C is the capacitance value of the variable capacitance section 12. This indicates that it is impossible to change the oscillation frequency f of the DCO circuit 10 completely linearly even if the capacitance value of the variable capacitance section 12 is changed linearly.

However, in the frequency synthesizer of FIG. 12, the change in the capacitance value of the variable capacitance section 12 can be finely tuned for each step by changing the ratio $T_{on}:T_{off}$ for each step. With this fine tuning, the oscillation frequency f of the DCO circuit 10 can be changed linearly.

Embodiment 4

Figure 15:
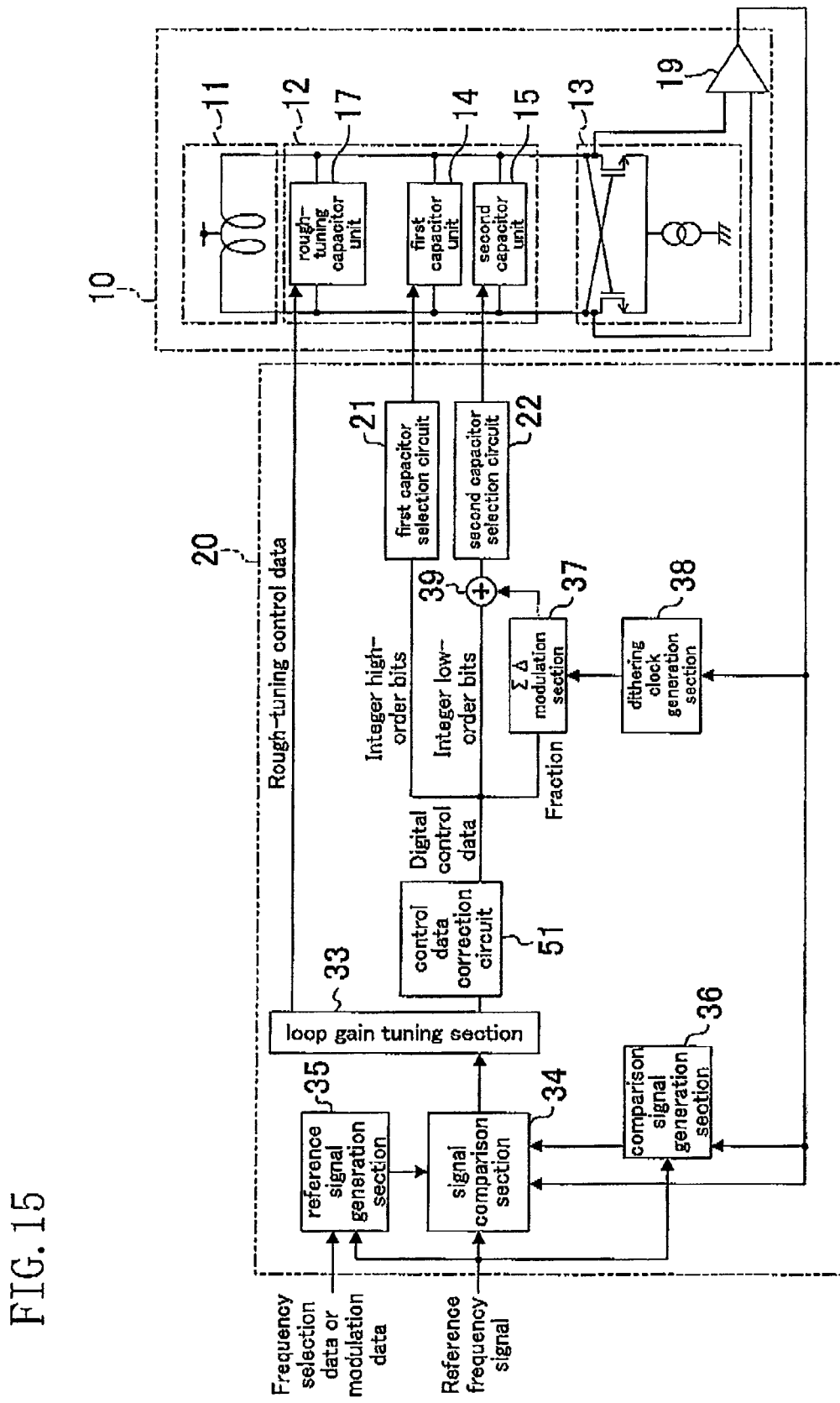
FIG. 15 is a block diagram of a frequency synthesizer of Embodiment 4 of the present invention.

Hereinafter, Embodiment 4 of the present invention will be described with reference to the relevant drawings. FIG. 15 shows a circuit configuration of a frequency synthesizer of Embodiment 4. In FIG. 15, the same components as those in FIG. 7 are denoted by the same reference numerals, and description thereof is omitted here.

As shown in FIG. 15, the oscillation frequency control unit 20 in this embodiment has a control data correction circuit 51 for correcting the digital control data so that the oscillation frequency f of the DCO circuit 10 can be changed linearly.

The control sensitivity $K_{dco}$ of the DCO circuit 10, which is the change amount in oscillation frequency for each unit change amount in digital control data, is expressed by $K_{dco}=(f_1'-f_1)/\Delta Wo$ where $f_1$ is an oscillation frequency observed when the digital control data is Wo1, and $f_1'$ is an oscillation frequency observed when the digital control data is Wo1' that is greater than Wo1 by ΔWo. Then, an oscillation frequency f2 observed when the digital control data is Wo2 will be $K_{dco} \times$ Wo2+$f_0$ (where $f_0$ is an oscillation frequency observed when Wo=0).

However, the oscillation frequency f of the DCO circuit 10 is 1/(2π√(LC)) where L is the inductance of the inductor 11 and C is the capacitance value of the variable capacitance section 12 as described above. If the difference of f2 from f1 is large, therefore, a deviation will occur in oscillation frequency.

In view of the above, the oscillation frequency control unit 20 in this embodiment has the control data correction circuit 51 to perform correction, and controls the DCO circuit 10 using the corrected digital control data. The correction may be made in the following manner.

The frequency f of the DCO circuit is expressed by Equation (1):

$$f = \frac{1}{2\pi\sqrt{LC}} \quad (1)$$

From Equation (1), Equation (2) below is derived.

$$\frac{\partial f}{\partial C} = \frac{-f}{2C} = -2\pi^2 L f^3 \quad (2)$$

A change $\Delta f$ in frequency with respect to a change $\Delta W$ in digital control data is expressed by Equation (3):

$$\Delta f = \frac{\partial f}{\partial C} \cdot \Delta C = -2\pi^2 L f^3 \cdot \Delta C \quad (3)$$

From the above, control sensitivity $K_{dco1}$, indicating a change in frequency observed when the capacitance value changes by $\Delta C$, when $f=f_1$ is expressed by Equation (4):

$$K_{dco1} = -2\pi^2 L f_1^3 \cdot \Delta C \quad (4)$$

Also, control sensitivity $K_{dco2}$ when $f=f_2$ is expressed by Equation (5):

$$K_{dco2} = -2\pi^2 L f_3^2 \cdot \Delta C = \frac{f_2^3}{f_1^3} \cdot K_{dco1} \quad (5)$$

A change in a given frequency f with respect to a sufficiently small data change dx can be expressed by Equation (6):

$$\frac{df}{dx} = \frac{f^3}{f_1^3} \cdot K_{dco1} \quad (6)$$

From Equation (6), Equation (7) below is derived.

$$f = \frac{f_1}{\sqrt{-2\frac{K_{dco1}}{f_1} x + 1}} \quad (7)$$

Equation (7) can be transformed to Equation (8) below. The change amount $\Delta W$ in digital control data for the given frequency f may satisfy Equation (8).

$$\Delta W = -\frac{f_1}{2K_{dco1}} \cdot \left(\frac{f_1^2 - f^2}{f^2}\right) \quad (8)$$

Equation (8) can further be approximated and simplified into Expression (9):

$$\Delta W = -\frac{f_1}{2K_{dco1}} \cdot \left(\frac{f_1^2 - f^2}{f^2}\right) \quad (9)$$
$$= -\frac{f_1}{2K_{dco1}} \cdot \frac{(f_1+f)(f_1-f)}{f^2}$$
$$\approx -\frac{f_1}{2K_{dco1}} \cdot \frac{2f(f_1-f)}{f^2}$$
$$= -\frac{f_1}{f} \cdot \frac{f_1-f}{K_{dco1}}$$

If no correction is made, the change amount $\Delta W$ in digital control data to give a given frequency f is derived from Equation (10)

$$f = K_{dco1} \cdot \Delta W + f_1 \quad (10)$$

as Equation (11):

$$\Delta W = -\frac{f_1 - f}{K_{dco1}} \quad (11)$$

That is, when the control sensitivity $K_{dco1}$ is measured at the frequency $f_1$ as a reference, a correction coefficient $\alpha a$ for obtaining a change amount $\Delta Wc$ in digital control data required to give the frequency f as a target precisely should satisfy Equation (12):

$$\Delta Wc = \alpha a \Delta W = -\frac{f_1}{2K_{dco1}} \cdot \left(\frac{f_1^2 - f^2}{f^2}\right) \quad (12)$$

Thus, as expressed by Equation (13) below, the correction coefficient $\alpha a$ is a coefficient corresponding to the ratio of the reference frequency $f_1$ to the target frequency f.

$$\alpha a = \frac{f_1}{2} \cdot \left(\frac{f_1 - f}{f^2}\right) \quad (13)$$

Also, a correction coefficient $\alpha b$ used for approximate correction as shown in Equation (9) above may satisfy Equation (14)

$$\Delta Wc = \alpha b \Delta W = -\frac{f_1}{f} \cdot \frac{f_1 - f}{K_{dco1}} \quad (14)$$

and is derived as Equation (15):

$$\alpha b = \frac{f_1}{f} \quad (15)$$

In this case, correction can be made with a simple ratio of the reference frequency $f_1$ to the target frequency f, and thus the linearity can be easily improved.

In Embodiment 4, the control data correction circuit 51 was provided in the frequency synthesizer of Embodiment 1. The control data correction circuit 51 may also be provided in the frequency synthesizer of any other embodiment.

In Embodiments 1, 2 and 4, seven first variable capacitors and seven second variable capacitors were provided and $\Delta C1$ was set eight times as large as $\Delta C2$. For i (i is an integer equal to or more than 1) first variable capacitors and (j is an integer equal to or more than 1) second variable capacitors, the change amount $\Delta C1$ in the capacitance value of the individual first variable capacitors may be (j+1) times as large as the change amount ΔC2 in the capacitance value of the individual second variable capacitors. In this case, having the i first variable capacitors and the j second variable capacitors, the capacitance value of the variable capacitance section 12 can be changed in (i+1)×(j+1) stages. In this case, also, the change amount in capacitance value at each step is ΔC2, permitting linear change in the capacitance value of the variable capacitance section 12.

In Embodiment 3 including its alterations, i first variable capacitors and at least 2j+1 second variable capacitors may be provided, and the change amount ΔC1 in the capacitance value of the individual first variable capacitors may be (j+1) times as large as the change amount ΔC2 in the capacitance value of the individual second variable capacitors.

Embodiment 5

Figure 16:
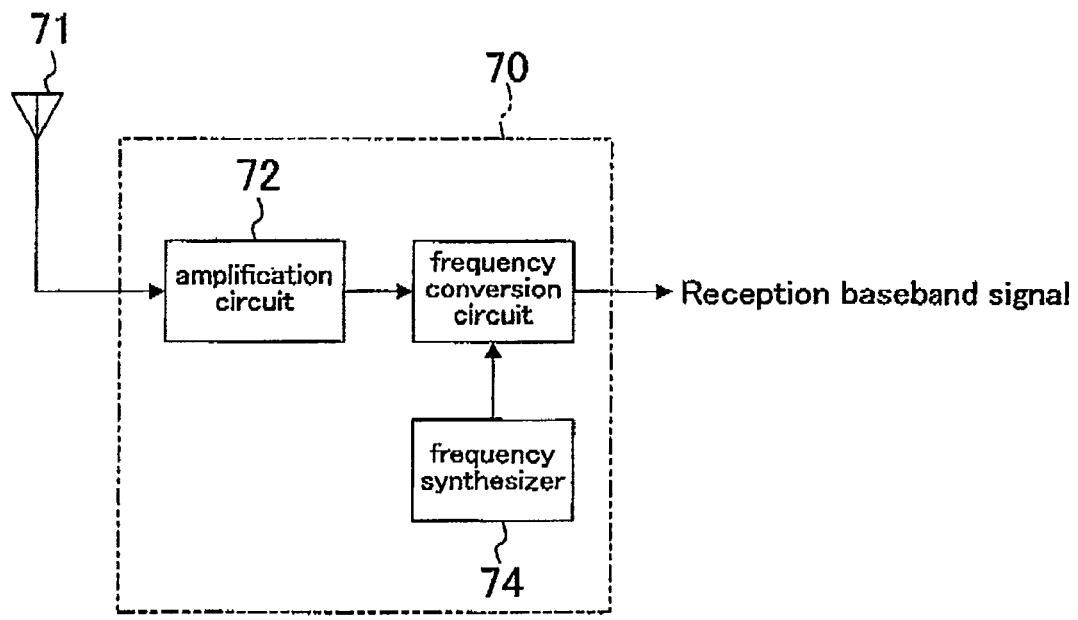
FIG. 16 is a block diagram of a radio communication apparatus of Embodiment 5 of the present invention.

Hereinafter, Embodiment 5 of the present invention will be described with reference to the relevant drawings. FIG. 16 shows a circuit configuration of a communication apparatus of Embodiment 5.

As shown in FIG. 16, in the communication apparatus of this embodiment, a signal received via an antenna 71 is amplified by an amplification circuit 72 of a receiver circuit 70 and then converted to a reception baseband signal using a local oscillation signal generated by a frequency synthesizer 74.

By using the frequency synthesizer of Embodiment 1 for the frequency synthesizer 74, the linearity of the differential capacitance value in the variable capacitance section of the DCO circuit can be maintained over high-order bits and low-order bits. Also, since the parasitic capacitance can be reduced with the reduced area, a communication apparatus adaptable for wide-range frequency variation can be provided.

Any of the frequency synthesizers of the other embodiments and alterations may also be used in place of the frequency synthesizer of Embodiment 1.

Embodiment 6

Figure 17:
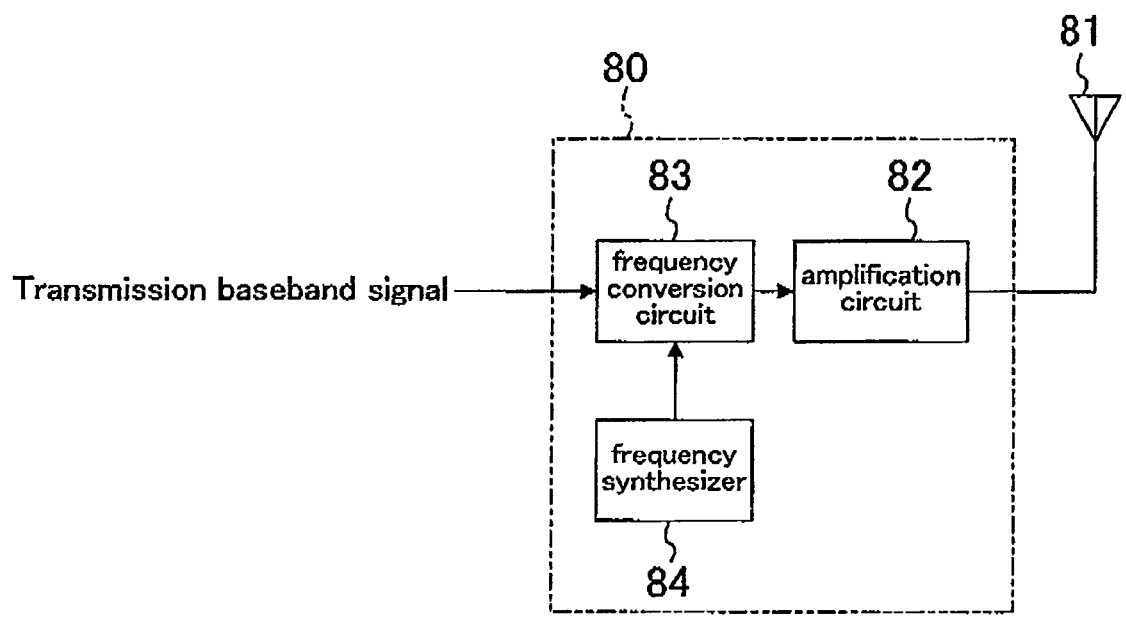
FIG. 17 is a block diagram of a radio communication apparatus of Embodiment 6 of the present invention.

Hereinafter, Embodiment 6 of the present invention will be described with reference to the relevant drawings. FIG. 17 shows a circuit configuration of a communication apparatus of Embodiment 6.

As shown in FIG. 17, in the communication apparatus of this embodiment, a transmission baseband signal is converted to a transmission signal by a frequency conversion circuit 83 of a transmitter circuit 80 using a local oscillation signal generated by a frequency synthesizer 84, then amplified by an amplification circuit 82 and transmitted from an antenna 81.

By using the frequency synthesizer of Embodiment 1 for the frequency synthesizer 84, the linearity of the differential capacitance value in the variable capacitance section of the DCO circuit can be maintained over high-order bits and low-order bits. Also, since the parasitic capacitance can be reduced with the reduced area, a communication apparatus adaptable for wide-range frequency variation can be provided.

Figure 18:
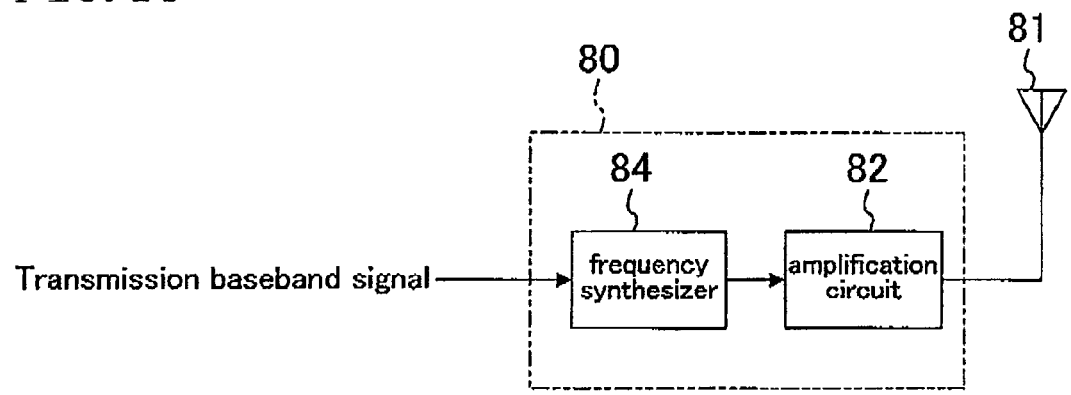
FIG. 18 is a block diagram of an alteration to the radio communication apparatus of Embodiment 6 of the present invention.
Figure 19:
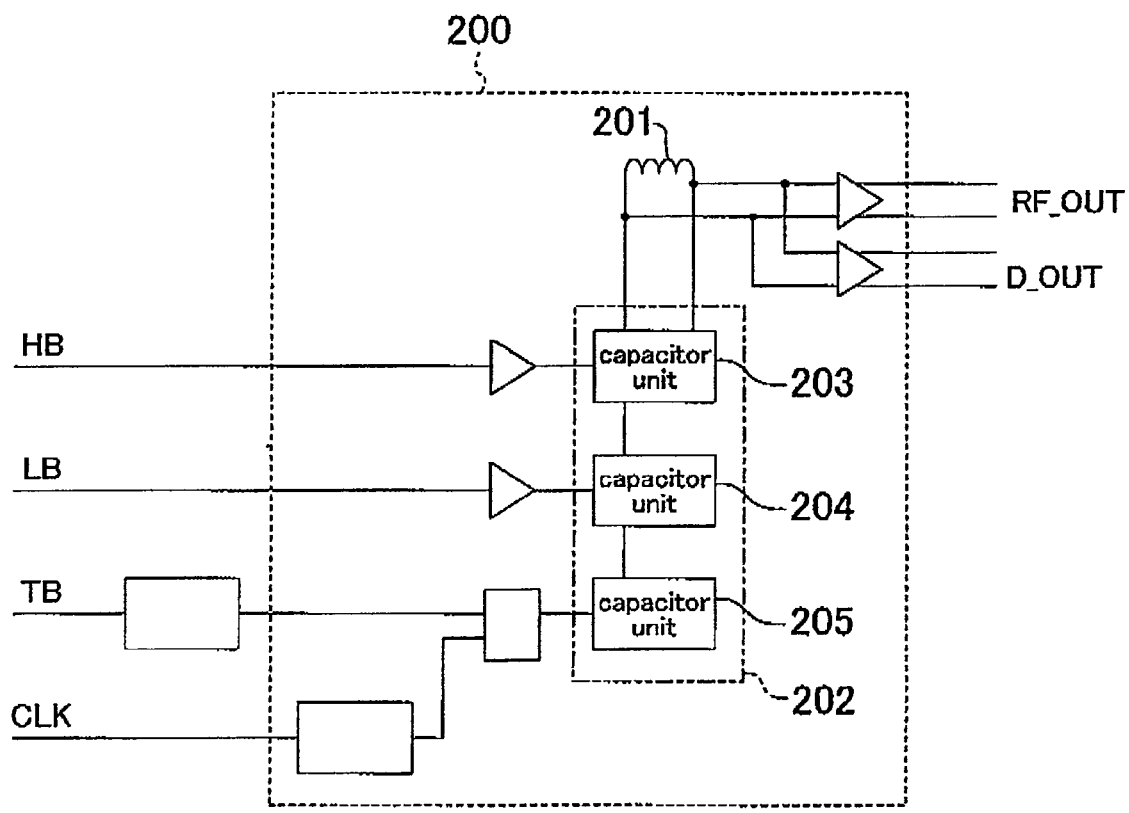
FIG. 19 is a block diagram of a conventional digital controlled oscillator.
Figure 20:
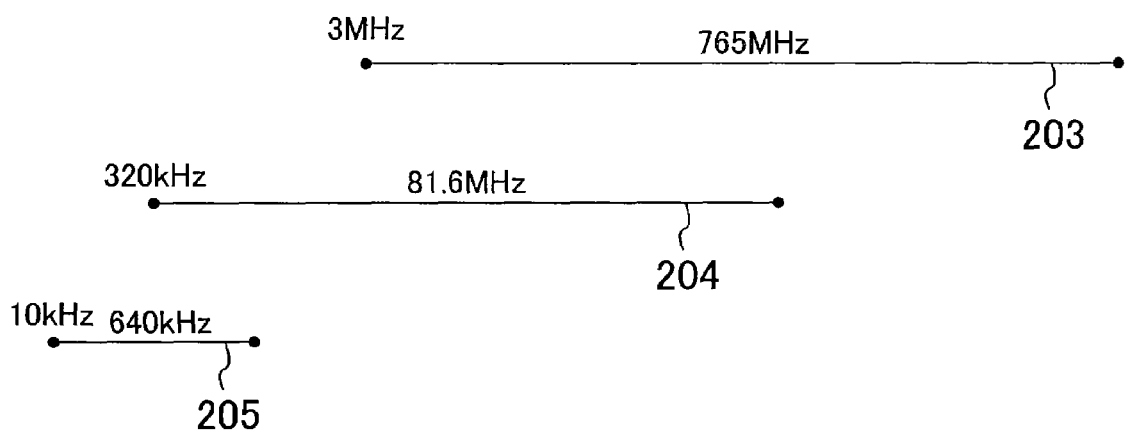
FIG. 20 is a view showing the relationship between capacitor arrays in the conventional digital controlled oscillator and the control frequencies.

Alternatively, as shown in FIG. 18, the frequency synthesizer 84 may be used as a modulation circuit. In this case, with improved linearity of the DCO circuit, it is possible to implement a transmitter permitting highly accurate modulation.

Any of the frequency synthesizers of the other embodiments and alterations may also be used in place of the frequency synthesizer of Embodiment 1.

As described above, according to the present invention, a digital controlled oscillator wide in the range within which the frequency changes linearly and small in occupation area and a control method for the same can be implemented. The invention is therefore applicable to a digital controlled oscillator used for a semiconductor integrated circuit, a frequency synthesizer including the same, a control method for the same, a radio communication apparatus using such a frequency synthesizer, and the like.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A digital controlled oscillator comprising:
    an oscillator unit including a variable capacitance section having a first capacitor unit and a second capacitor unit and generating a signal having an oscillation frequency corresponding to a capacitance value of the variable capacitance section, the first capacitor unit including a plurality of first variable capacitors selectable between a first capacitive state and a second capacitive state larger in capacitance value than the first capacitive state, the second capacitor unit including a plurality of second variable capacitors selectable between a third capacitive state and a fourth capacitive state larger in capacitance value than the third capacitive state,
    wherein a first change amount as a difference in capacitance value between the first capacitive state and the second capacitive state is a value obtained by multiplying a second change amount as a difference in capacitance value between the third capacitive state and the fourth capacitive state by an integer equal to or more than 2, and
    the plurality of the first variable capacitors have the same first change amount as one another, and
    each of the second variable capacitors included in the second capacitor unit is controlled with ΣΔ modulation.

2. The digital controlled oscillator of claim 1, wherein the variable capacitance section has a rough-tuning capacitor unit for roughly tuning the oscillation frequency, and
    each of the first and second capacitor units is a fine-tuning capacitor unit for finely tuning the oscillation frequency.

3. A digital controlled oscillator comprising:
    an oscillator unit including a variable capacitance section having a first capacitor unit and a second capacitor unit and generating a signal having an oscillation frequency corresponding to a capacitance value of the variable capacitance section, the first capacitor unit including a plurality of first variable capacitors selectable between a first capacitive state and a second capacitive state larger in capacitance value than the first capacitive state, the second capacitor unit including one or more second variable capacitors selectable between a third capacitive state and a fourth capacitive state larger in capacitance value than the third capacitive state,
    wherein a first change amount as a difference in capacitance value between the first capacitive state and the second capacitive state is a value obtained by multiplying a second change amount as a difference in capacitance value between the third capacitive state and the fourth capacitive state by an integer equal to or more than 2, and the number of second variable capacitors is equal to or more than a value obtained by subtracting 1 from the integer equal to or more than 2, wherein the variable capacitance section has a third capacitor unit including a plurality of third variable capacitors selectable between a fifth capacitive state and a sixth capacitive state larger in capacitance value than the fifth capacitive state, a third change amount as a difference in capacitance value between the fifth capacitive state and the six capacitive state is equal to the second change amount, and each of the third variable capacitors included in the third capacitor unit is controlled with ΣΔ modulation.

4. The digital controlled oscillator of claim 3, wherein the plurality of the first variable capacitors have the same first change amount as one another.

5. A frequency synthesizer comprising:

a digital controlled oscillator unit including a variable capacitance section having a first capacitor unit and a second capacitor unit and generating a signal having an oscillation frequency corresponding to a capacitance value of the variable capacitance section, the first capacitor unit including a plurality of first variable capacitors each having a first capacitive state and a second capacitive state larger in capacitance value than the first capacitive state, the second capacitor unit including a plurality of second variable capacitors each having a third capacitive state and a fourth capacitive state larger in capacitance value than the third capacitive state; and an oscillation frequency control unit for controlling the capacitance value of the variable capacitance section by switching the individual first variable capacitors between the first capacitive state and the second capacitive state and switching the individual second variable capacitors between the third capacitive state and the fourth capacitive state, to control the oscillation frequency, wherein a first change amount as a difference in capacitance value between the first capacitive state and the second capacitive state is a value obtained by multiplying a second change amount as a difference in capacitance value between the third capacitive state and the fourth capacitive state by an integer equal to or more than 2, wherein the plurality of the second variable capacitors included in the second capacitor unit are controlled with ΣΔ modulation, wherein the oscillation frequency control unit comprises:

a first capacitor selection circuit for selecting any of the first variable capacitors to be put into the second capacitive state;

a second capacitor selection circuit for selecting any of the second variable capacitors to be put into the fourth capacitive state;

a reference signal generation section for generating a reference signal;

a comparison signal generation section for generating a comparison signal based on the output of the digital controlled oscillator unit;

a signal comparison section for comparing at least the phase or the frequency between the reference signal and the comparison signal and outputting a difference signal; and a loop gain tuning section for generating a multi-bit digital control signal for controlling the first capacitor selection circuit and the second capacitor selection circuit based on the difference signal, wherein the digital control signal includes a low-order bit signal for controlling a capacitance value of the second capacitor unit, a high-order bit signal for controlling a capacitance value of the first capacitor unit, and a fraction bit signal for changing the capacitance value of the variable capacitance section by a finer amount than the second change amount, wherein the second capacitor selection circuit puts any of the second variable capacitors corresponding to the low-order bit signal into the fourth capacitive state, and the oscillation frequency control unit further comprises a ΣΔ modulation section for ΣΔ-modulating the fraction bit signal and an adder for adding the ΣΔ-modulated fraction bit signal to the low-order bit signal.

6. The frequency synthesizer of claim 5, wherein the number of the second variable capacitors is equal to or more than a value obtained by subtracting 1 from double the integer equal to or more than 2, and the oscillation frequency control unit further comprises:

a subtraction circuit for subtracting 1 from the high-order bit signal;

an addition circuit for adding the integer equal to or more than 2 to the low-order bit signal; and an arithmetic circuit control section for switching the drive state of the subtraction circuit and addition circuit, and the arithmetic circuit control section switches the subtraction circuit and the addition circuit to an operating state if at least the high-order bit signal is equal to or greater than 1.

7. The frequency synthesizer of claim 6, wherein the arithmetic circuit control section controls the duration for which the subtraction circuit and the addition circuit are in the operating state based on the low-order bit signal.

8. The frequency synthesizer of claim 6, wherein the arithmetic circuit control section controls the duration for which the subtraction circuit and the addition circuit are in the operating state in synchronization with the ΣΔ modulation section.

9. The frequency synthesizer of claim 8, wherein $$T_{off}:T_{on}=k:m-k$$

is satisfied where m is the integer equal to or more than 2, k is a value of the low-order bit signal, $T_{on}$ is the duration for which the subtraction circuit and the addition circuit are in the operating state, and $T_{off}$ is the duration for which the subtraction circuit and the addition circuit are in a stop state.

10. The frequency synthesizer of claim 7, wherein the first variable capacitors and the second variable capacitors are different in physical structure from each other.

11. The frequency synthesizer of claim 10, wherein each of the first variable capacitors includes an interconnect capacitance and a switch, and each of the second variable capacitors is a MOS varactor.

12. A frequency synthesizer comprising:

a digital controlled oscillator unit including a variable capacitance section having a first capacitor unit and a second capacitor unit and generating a signal having an oscillation frequency corresponding to a capacitance value of the variable capacitance section, the first capacitor unit including a plurality of first variable capacitors each having a first capacitive state and a second capacitive state larger in capacitance value than the first capacitive state, the second capacitor unit including one or more second variable capacitors each having a third capacitive state and a fourth capacitive state larger in capacitance value than the third capacitive state; and an oscillation frequency control unit for controlling the capacitance value of the variable capacitance section by switching the individual first variable capacitors between the first capacitive state and the second capacitive state and switching the individual second variable capacitors between the third capacitive state and the fourth capacitive state, to control the oscillation frequency, wherein a first change amount as a difference in capacitance value between the first capacitive state and the second capacitive state is a value obtained by multiplying a second change amount as a difference in capacitance value between the third capacitive state and the fourth capacitive state by an integer equal to or more than 2, wherein the number of second variable capacitors is equal to or more than a value obtained by subtracting 1 from the integer equal to or more than 2, wherein the plurality of the second variable capacitors included in the second capacitor unit are controlled with ΣΔ modulation, wherein the oscillation frequency control unit comprises:
a first capacitor selection circuit for selecting any of the first variable capacitors to be put into the second capacitive state;
a second capacitor selection circuit for selecting any of the second variable capacitors to be put into the fourth capacitive state;
a reference signal generation section for generating a reference signal;
a comparison signal generation section for generating a comparison signal based on the output of the digital controlled oscillator unit;
a signal comparison section for comparing at least the phase or the frequency between the reference signal and the comparison signal and outputting a difference signal; and
a loop gain tuning section for generating a multi-bit digital control signal for controlling the first capacitor selection circuit and the second capacitor selection circuit based on the difference signal, wherein the second capacitor selection circuit puts any of the second variable capacitors corresponding to the low-order bit signal into the fourth capacitive state, wherein the variable capacitance section has a third capacitor unit including a plurality of third variable capacitors, the digital control signal includes a low-order bit signal for controlling a capacitance value of the second capacitor unit, a high-order bit signal for controlling a capacitance value of the first capacitor unit, and a fraction bit signal for controlling the third capacitor unit, and the oscillation frequency control unit includes a ΣΔ modulation section for ΣΔ-modulating the fraction bit signal and a third capacitor selection circuit for converting the ΣΔ-modulated fraction bit signal to a corresponding thermometer code.

13. The frequency synthesizer of claim 12, wherein the number of the second variable capacitors is equal to or more than a value obtained by subtracting 1 from double the integer equal to or more than 2, and the oscillation frequency control unit further comprises:
a subtraction circuit for subtracting 1 from the high-order bit signal;

an addition circuit for adding the integer equal to or more than 2 to the low-order bit signal; and an arithmetic circuit control section for switching the drive state of the subtraction circuit and addition circuit, and the arithmetic circuit control section puts the subtraction circuit and the addition circuit in an operating state if at least the high-order bit signal is equal to or greater than 1.

14. The frequency synthesizer of claim 12, wherein the number of the third variable capacitors is equal to or more than a value obtained by subtracting 1 from double the integer equal to or more than 2, and the oscillation frequency control unit further comprises:
a subtraction circuit for subtracting 1 from the high-order bit signal;
an addition circuit for adding the integer equal to or more than 2 to the ΣΔ-modulated fraction bit signal; and
an arithmetic circuit control section for switching the drive state of the subtraction circuit and addition circuit, and
the arithmetic circuit control section puts the subtraction circuit and the addition circuit in an operating state based on the digital control data.

15. The frequency synthesizer of claim 12, wherein the plurality of the first variable capacitors have the same first change amount as one another.

16. A frequency synthesizer comprising:
a digital controlled oscillator unit including a variable capacitance section having a first capacitor unit and a second capacitor unit and generating a signal having an oscillation frequency corresponding to a capacitance value of the variable capacitance section, the first capacitor unit including a plurality of first variable capacitors each having a first capacitive state and a second capacitive state larger in capacitance value than the first capacitive state, the second capacitor unit including a plurality of second variable capacitors each having a third capacitive state and a fourth capacitive state larger in capacitance value than the third capacitive state; and an oscillation frequency control unit for controlling the capacitance value of the variable capacitance section to control the oscillation frequency, wherein the oscillation frequency control unit comprises:
a first capacitor selection circuit;
a second capacitor selection circuit;
a reference signal generation section for generating a reference signal;
a comparison signal generation section for generating a comparison signal based on the output of the digital controlled oscillator unit;
a signal comparison section for comparing at least the phase or the frequency between the reference signal and the comparison signal and outputting a difference signal;
a loop gain tuning section for generating a multi-bit digital control signal for controlling the first capacitor selection circuit and the second capacitor selection circuit based on the difference signal; and
a control data correction circuit for correcting a value of the digital control data based on the capacitance value of the variable capacitance section, wherein the digital control signal includes a low-order bit signal for controlling a capacitance value of the second capacitor unit, and a high-order bit signal for controlling a capacitance value of the first capacitor unit, the first capacitor selection circuit puts any of the first variable capacitors corresponding to the high-order bit signal into the second capacitive state, and the second capacitor selection circuit puts any of the second variable capacitors corresponding to the low-order bit signal into the fourth capacitive state, wherein the control data correction circuit corrects the digital control data so that the change amount in oscillation frequency for each unit change amount in digital control data is constant, and the change amount in oscillation frequency for each unit change amount in digital control data is expressed by $$\frac{df}{dx} = \frac{f^3}{f_1^3} \cdot K_{dco1} \quad (1)$$

where df/dx is the change amount in oscillation frequency for each unit change amount in digital control data, f and $f_1$ is an oscillation frequency in a given digital control data, and $K_{dco1}$ is control sensitivity of $f_1$.

17. A frequency synthesizer comprising:

a digital controlled oscillator unit including a variable capacitance section having a first capacitor unit and a second capacitor unit and generating a signal having an oscillation frequency corresponding to a capacitance value of the variable capacitance section, the first capacitor unit including a plurality of first variable capacitors each having a first capacitive state and a second capacitive state larger in capacitance value than the first capacitive state, the second capacitor unit including a plurality of second variable capacitors each having a third capacitive state and a fourth capacitive state larger in capacitance value than the third capacitive state; and an oscillation frequency control unit for controlling the capacitance value of the variable capacitance section to control the oscillation frequency, wherein the oscillation frequency control unit comprises:
a first capacitor selection circuit;
a second capacitor selection circuit;
a reference signal generation section for generating a reference signal;
a comparison signal generation section for generating a comparison signal based on the output of the digital controlled oscillator unit;
a signal comparison section for comparing at least the phase or the frequency between the reference signal and the comparison signal and outputting a difference signal;
a loop gain tuning section for generating a multi-bit digital control signal for controlling the first capacitor selection circuit and the second capacitor selection circuit based on the difference signal; and
a control data correction circuit for correcting the value of the digital control data based on the capacitance value of the variable capacitance section, wherein the digital control signal includes a low-order bit signal for controlling a capacitance value of the second capacitor unit, and a high-order bit signal for controlling a capacitance value of the first capacitor unit, the first capacitor selection circuit puts any of the first variable capacitors corresponding to the high-order bit signal into the second capacitive state, and the second capacitor selection circuit puts any of the second variable capacitors corresponding to the low-order bit signal into the fourth capacitive state, wherein the control data correction circuit has control sensitivity that is a change amount in oscillation frequency for each unit change amount in digital control data at a reference frequency, and generates the digital control data in the oscillation frequency based on $K_{dco1}=(f_1'-f_1)/\Delta W_o(2)$, the control data correction circuit corrects the digital control data by multiplying the digital control data by a coefficient corresponding to a ratio of the oscillation frequency to the reference frequency, and the coefficient is expressed by $$\alpha = \frac{f_1}{2} \cdot \left(\frac{f_1 + f}{f^2}\right) \text{ or} \quad (3)$$

$$\alpha = \frac{f_1}{f}, \quad (4)$$

where $K_{dco1}$ is the control sensitivity of $f_1$, f and $f_1$ are an oscillation frequency in a given digital control data, $f_1'$ is an oscillation frequency that is changed to be greater than the digital control data by an unit change amount when the oscillation frequency is $f_1$, $\Delta W_o$ is an unit change amount in digital control data, $\alpha$ is the coefficient.

18. A control method for a digital controlled oscillator, for controlling an oscillation frequency of a digital controlled oscillator, the digital controlled oscillator comprising a variable capacitance section having a first capacitor unit including a plurality of first variable capacitors and a second capacitor unit including a plurality of second variable capacitors, the method comprising the steps of:

(a) generating multi-bit digital control data including high-order bit data for controlling the first capacitor unit and low-order bit data for controlling the second capacitor unit;

(b) selecting any of the first variable capacitors and second variable capacitors based on the digital control data to obtain an oscillation frequency corresponding to the digital control data; and (c) subtracting 1 from the high-order bit data and adding the integer equal to or more than 2 to the low-order bit data, wherein:

the step (b) comprises the steps of:
(b1) switching a capacitance value of any of the first variable capacitors corresponding to the high-order bit data from a first capacitive state to a second capacitive state different from the first capacitive state by the first change amount; and
(b2) switching a capacitance value of any of the second variable capacitors corresponding to the low-order bit data from a third capacitive state to a fourth capacitive state different from the third capacitive state by the second change amount, the digital control data includes fraction bit data, the step (b) further comprises the steps of:
(b3) ΣΔ-modulating the fraction bit data; and
(b4) before the step (b2), adding the ΣΔ-modulated fraction bit data to the low-order bit data, and the step (c) is selectively executed before the step (b).

19. A control method for a digital controlled oscillator, for controlling an oscillation frequency of a digital controlled oscillator, the digital controlled oscillator comprising a variable capacitance section having a first capacitor unit including a plurality of first variable capacitors and a second capacitor unit including a plurality of second variable capacitors, the method comprising the steps of:

(a) generating multi-bit digital control data including high-order bit data for controlling the first capacitor unit and low-order bit data for controlling the second capacitor unit;
(b) selecting any of the first variable capacitors and second variable capacitors based on the digital control data to obtain an oscillation frequency corresponding to the digital control data; and
(c) subtracting 1 from the high-order bit data and adding the integer equal to or more than 2 to the fraction bit data, wherein:
the step (b) comprises the steps of:
 (b1) switching a capacitance value of any of the first variable capacitors corresponding to the high-order bit data from a first capacitive state to a second capacitive state different from the first capacitive state by the first change amount; and
 (b2) switching a capacitance value of any of the second variable capacitors corresponding to the low-order bit data from a third capacitive state to a fourth capacitive state different from the third capacitive state by the second change amount,
the digital control data includes fraction bit data,
the step (b) further comprises the steps of:
 (b3) ΣΔ-modulating the fraction bit data; and
 (b4) before the step (b2), adding the ΣΔ-modulated fraction bit data to the low-order bit data, and
the step (c) is selectively executed before the step (b).

20. The control method of claim 19, further comprising the step of:
(d) selecting execution of the step (c) based on the digital control data.

21. The control method of claim 20, wherein the step (d) selects execution of the step (c) based on the value of the low-order bit data.

22. The control method of claim 20, wherein the step (d) selects execution of the step (c) so that the step (c) is executed in synchronization with the ΣΔ modulation.

23. The control method of claim 20, wherein the step d selects execution of the step (c) so that $$T_{off}:T_{on}=k:m-k$$

is satisfied where m is the integer equal to or more than 2, k is a value of the low-order bit data, $T_{on}$ is the duration for which execution of the step (c) is selected, and $T_{off}$ is the duration for which the step (c) is not executed.

24. A control method for a digital controlled oscillator, for controlling an oscillation frequency of a digital controlled oscillator, the digital controlled oscillator comprising a variable capacitance section having a first capacitor unit including a plurality of first variable capacitors and a second capacitor unit including a plurality of second variable capacitors, the method comprising the steps of:
(a) generating multi-bit digital control data including high-order bit data for controlling the first capacitor unit and low-order bit data for controlling the second capacitor unit; and
(b) selecting any of the first variable capacitors and second variable capacitors based on the digital control data to obtain an oscillation frequency corresponding to the digital control data,
wherein the step (a) comprises the steps of:
 (a1) calculating control sensitivity based on a change amount between digital control data in the case that the oscillation frequency is a first frequency and digital control data in the case that the oscillation frequency is a second frequency, the control sensitivity being a change amount in oscillation frequency for each unit change amount in digital control data in the proximity of the first frequency; and
 (a2) calculating digital control data in the case that the oscillation frequency is a third frequency using the control sensitivity and a coefficient corresponding to a ratio of the first frequency to the third frequency, wherein:
the step (b) comprises the steps of:
 (b1) switching a capacitance value of any of the first variable capacitors corresponding to the high-order bit data from a first capacitive state to a second capacitive state different from the first capacitive state by the first change amount; and
 (b2) switching a capacitance value of any of the second variable capacitors corresponding to the low-order bit data from a third capacitive state to a fourth capacitive state different from the third capacitive state by the second change amount,
the digital control data includes fraction bit data, and
the step (b) further comprises the steps of:
 (b3) ΣΔ-modulating the fraction bit data; and
 (b4) before the step (b2), adding the ΣΔ-modulated fraction bit data to the low-order bit data.

* * * * *